United States Patent
Gans et al.

(10) Patent No.: US 11,810,640 B2
(45) Date of Patent: Nov. 7, 2023

(54) MEMORY INTERFACE WITH CONFIGURABLE HIGH-SPEED SERIAL DATA LANES FOR HIGH BANDWIDTH MEMORY

(71) Applicant: SUNRISE MEMORY CORPORATION, San Jose, CA (US)

(72) Inventors: Dean Gans, Nampa, ID (US); Aran Ziv, Foster City, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 14 days.

(21) Appl. No.: 17/666,255

(22) Filed: Feb. 7, 2022

(65) Prior Publication Data

US 2022/0254390 A1 Aug. 11, 2022

Related U.S. Application Data

(60) Provisional application No. 63/148,085, filed on Feb. 10, 2021.

(51) Int. Cl.
*G11C 7/10* (2006.01)
*H03K 19/20* (2006.01)

(52) U.S. Cl.
CPC ............ *G11C 7/1063* (2013.01); *G11C 7/109* (2013.01); *G11C 7/1015* (2013.01); *H03K 19/20* (2013.01)

(58) Field of Classification Search
CPC ..... G11C 7/1063; G11C 7/1015; G11C 7/109; G11C 5/04; H03K 19/20
See application file for complete search history.

(56) References Cited

U.S. PATENT DOCUMENTS

| 4,213,139 A | 7/1980 | Rao |
| 4,984,153 A | 1/1991 | Kregness et al. |
| 5,388,246 A | 2/1995 | Kasai |

(Continued)

FOREIGN PATENT DOCUMENTS

| CN | 107658317 A | 2/2018 |
| CN | 108649031 A | 10/2018 |

OTHER PUBLICATIONS

"Partial Search Report, European Patent Application No. 20748610.1", dated Sep. 29, 2022, 13 pages.

(Continued)

*Primary Examiner* — Son L Mai

(57) ABSTRACT

A memory module including a memory array of storage transistors and a control circuit where the control circuit includes a memory interface for providing high bandwidth access to the memory array on serial data lanes. In some embodiments, the control circuit of a memory module includes multiple transceivers for connecting to serial data lanes. In one embodiment, the memory interface of a memory module configures some transceivers for host connection or for upstream connection to an upstream memory module and configures other transceivers for downstream connection to a downstream memory module. In other embodiments, a multi-module memory device is formed using multiple memory modules connected in a cascade configuration or in a star configuration to provide high bandwidth memory access to all memory locations of the multiple memory modules using the given number of serial data lanes of the host connection.

44 Claims, 14 Drawing Sheets

(56) References Cited

U.S. PATENT DOCUMENTS

| | | | |
|---|---|---|---|
| 6,057,862 | A | 5/2000 | Margulis |
| 7,221,613 | B2 * | 5/2007 | Pelley ............... G11C 11/40618 |
| | | | 365/230.03 |
| 7,284,226 | B1 | 10/2007 | Kondapalli |
| 7,475,174 | B2 * | 1/2009 | Chow ................ G06F 13/1684 |
| | | | 710/72 |
| 8,244,993 | B2 * | 8/2012 | Grundy .................. G06F 12/06 |
| | | | 711/E12.001 |
| 8,417,917 | B2 | 4/2013 | Emma et al. |
| 8,653,672 | B2 | 2/2014 | Leedy |
| 9,256,026 | B2 | 2/2016 | Thacker et al. |
| 9,297,971 | B2 | 3/2016 | Thacker et al. |
| 9,502,345 | B2 | 11/2016 | Youn et al. |
| 9,799,761 | B2 | 10/2017 | Or-Bach et al. |
| 10,102,884 | B2 * | 10/2018 | Coteus .................. G11C 7/109 |
| 10,121,553 | B2 | 11/2018 | Harari et al. |
| 10,217,719 | B2 | 2/2019 | Watanabe et al. |
| 10,283,452 | B2 | 5/2019 | Zhu et al. |
| 10,283,493 | B1 | 5/2019 | Nishida |
| 10,319,696 | B1 | 6/2019 | Nakano |
| 10,644,826 | B2 | 4/2020 | Wuu et al. |
| 10,692,837 | B1 | 6/2020 | Nguyen et al. |
| 10,725,099 | B2 | 7/2020 | Ware |
| 10,742,217 | B2 | 8/2020 | Dabral et al. |
| 10,978,427 | B2 | 4/2021 | Li et al. |
| 11,152,343 | B1 | 10/2021 | Dokania et al. |
| 11,580,038 | B2 * | 2/2023 | Norman ................. G06F 9/541 |
| 2004/0043755 | A1 | 3/2004 | Shimooka et al. |
| 2006/0080457 | A1 | 4/2006 | Hiramatsu et al. |
| 2006/0212651 | A1 | 9/2006 | Ashmore |
| 2007/0192518 | A1 | 8/2007 | Rupanagunta et al. |
| 2008/0022026 | A1 | 1/2008 | Yang et al. |
| 2008/0091888 | A1 * | 4/2008 | Sandy ................ G06F 13/4282 |
| | | | 711/118 |
| 2010/0036960 | A1 | 2/2010 | Kowalewski |
| 2010/0121994 | A1 | 5/2010 | Kim et al. |
| 2011/0134705 | A1 | 6/2011 | Jones et al. |
| 2011/0310683 | A1 | 12/2011 | Gorobets |
| 2013/0007349 | A1 | 1/2013 | D'Abreu et al. |
| 2014/0075135 | A1 | 3/2014 | Choi et al. |
| 2014/0173017 | A1 | 6/2014 | Takagi et al. |
| 2015/0155876 | A1 | 6/2015 | Jayasena et al. |
| 2015/0220463 | A1 | 8/2015 | Fluman et al. |
| 2015/0263005 | A1 | 9/2015 | Zhao et al. |
| 2015/0347331 | A1 | 12/2015 | Park et al. |
| 2016/0013156 | A1 | 1/2016 | Zhai et al. |
| 2016/0035711 | A1 | 2/2016 | Hu |
| 2016/0079164 | A1 | 3/2016 | Fukuzumi et al. |
| 2016/0248631 | A1 | 8/2016 | Duchesneau |
| 2016/0321002 | A1 | 11/2016 | Jung et al. |
| 2018/0095127 | A1 | 4/2018 | Pappu et al. |
| 2018/0331042 | A1 | 11/2018 | Manusharow et al. |
| 2018/0357165 | A1 | 12/2018 | Helmick et al. |
| 2019/0028387 | A1 | 1/2019 | Gray |
| 2019/0043836 | A1 | 2/2019 | Fastow et al. |
| 2019/0121699 | A1 | 4/2019 | Cohen et al. |
| 2019/0130946 | A1 | 5/2019 | Sim et al. |
| 2019/0171391 | A1 | 6/2019 | Dubeyko et al. |
| 2019/0238134 | A1 | 8/2019 | Lee et al. |
| 2019/0303042 | A1 | 10/2019 | Kim et al. |
| 2019/0325945 | A1 | 10/2019 | Linus |
| 2019/0332321 | A1 | 10/2019 | Chen |
| 2019/0370005 | A1 | 12/2019 | Moloney et al. |
| 2019/0384884 | A1 | 12/2019 | Thuries et al. |
| 2020/0006306 | A1 | 1/2020 | Li |
| 2020/0098738 | A1 | 3/2020 | Herner et al. |
| 2020/0201718 | A1 | 6/2020 | Richter et al. |
| 2020/0227123 | A1 | 7/2020 | Salahuddin et al. |
| 2020/0243486 | A1 | 7/2020 | Quader et al. |
| 2020/0326889 | A1 | 10/2020 | Norman et al. |
| 2020/0341838 | A1 | 10/2020 | Hollis |
| 2020/0395328 | A1 | 12/2020 | Fastow et al. |
| 2021/0247910 | A1 | 8/2021 | Kim et al. |
| 2021/0248094 | A1 | 8/2021 | Norman et al. |
| 2021/0263866 | A1 | 8/2021 | Norman et al. |
| 2021/0265308 | A1 | 8/2021 | Norman et al. |

OTHER PUBLICATIONS

"PCT Search Report and Written Opinion, PCT/US2022/15497", dated Jul. 11, 2022, 20 pages.

"Invitation to Pay Additional Fees (PCT/ISA/206), PCT/US2020/015710", Mar. 20, 2020, 2 pages.

"PCT Search Report and Written Opinion, PCT/US2020/015710", dated Jun. 9, 2020.

"PCT Search Report and Written Opinion, PCT/US2021/016964", dated Jun. 15, 2021, 19 pages.

Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.

* cited by examiner

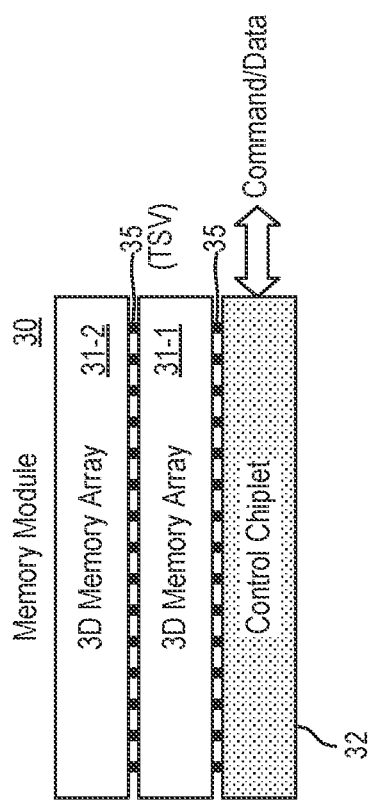
FIG. 2(a)
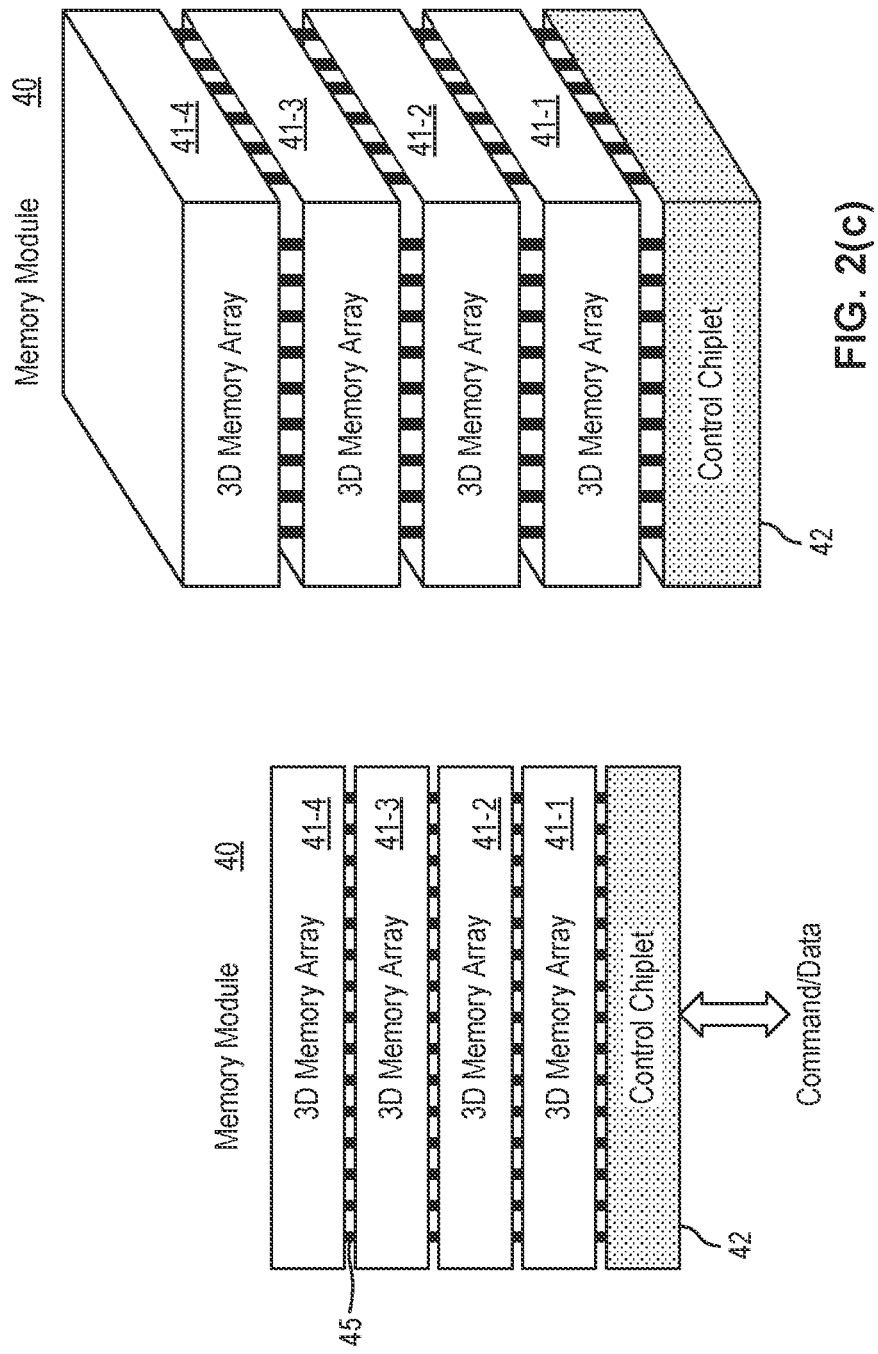
FIG. 2(b)
FIG. 2(c)

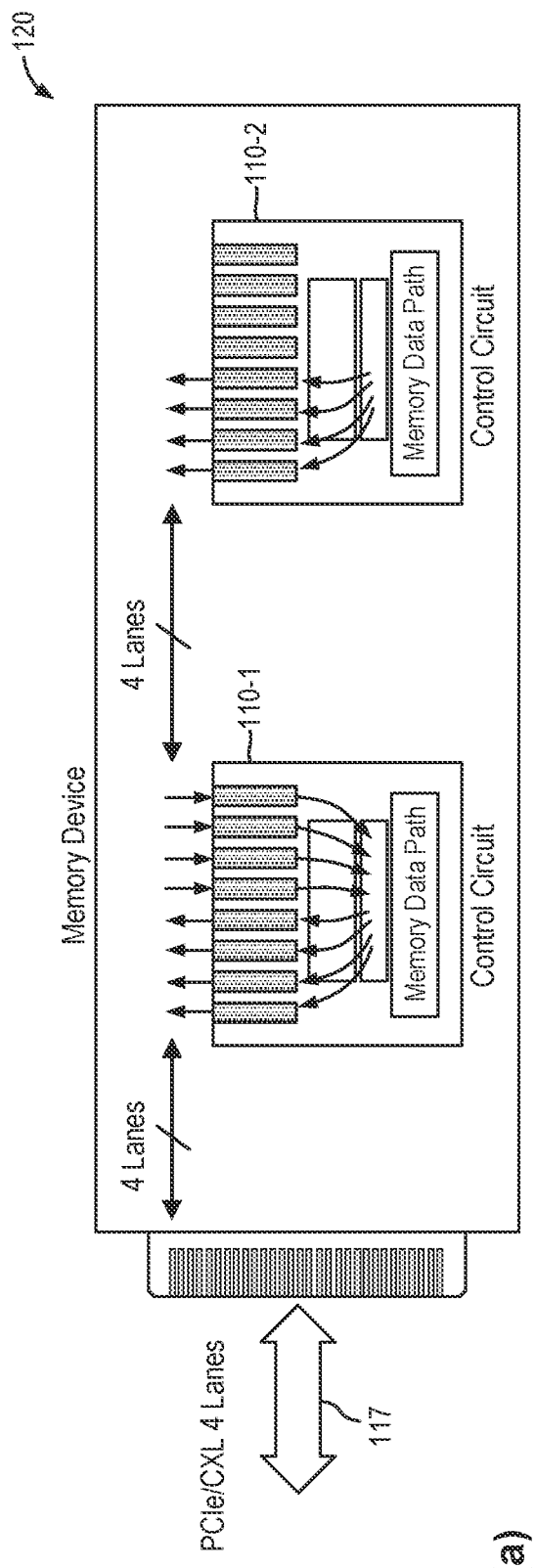 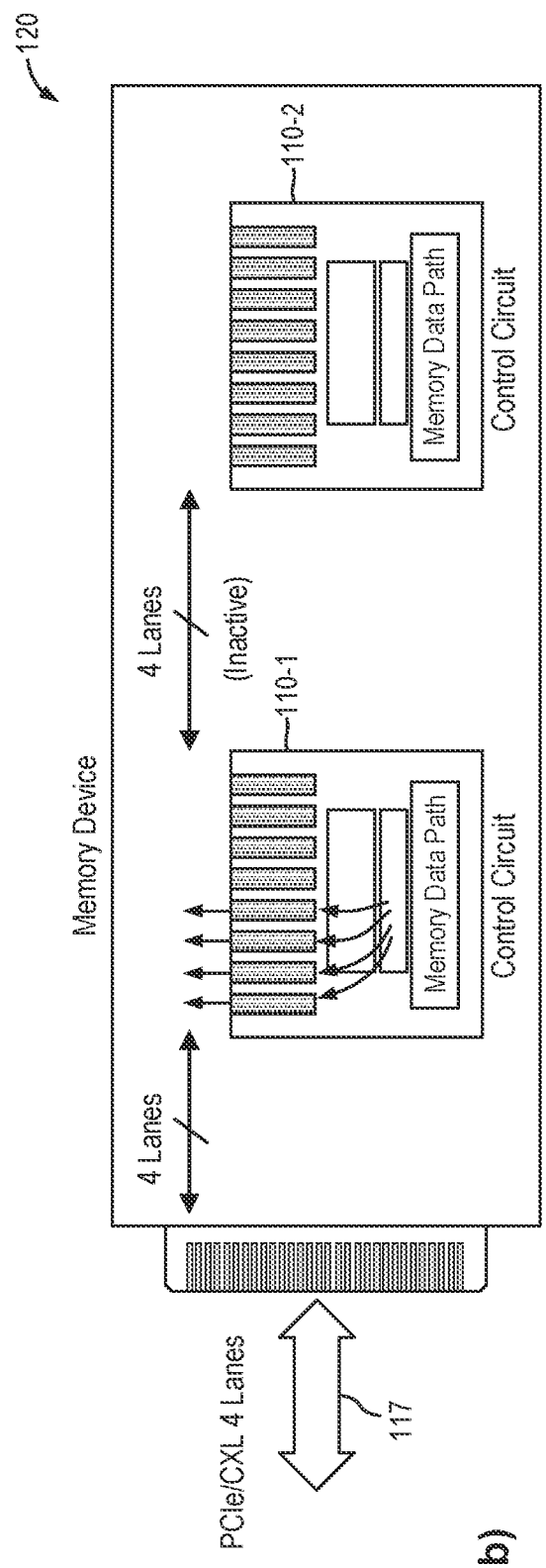
FIG. 10(a)
FIG. 10(b)

US 11,810,640 B2

MEMORY INTERFACE WITH CONFIGURABLE HIGH-SPEED SERIAL DATA LANES FOR HIGH BANDWIDTH MEMORY

CROSS REFERENCE TO RELATED APPLICATIONS

The present application claims benefit of U.S. provisional patent application ("Provisional patent application"), Ser. No. 63/148,085, entitled "MEMORY INTERFACE WITH CONFIGURABLE HIGH-SPEED SERIAL DATA LANES FOR HIGH BANDWIDTH MEMORY," filed on Feb. 10, 2021. The Provisional patent application is hereby incorporated by reference in its entirety.

FIELD OF THE INVENTION

The invention relates to semiconductor memory interface and, in particular, to systems and methods for a memory interface implemented using high speed serial data lanes.

BACKGROUND OF THE INVENTION

High density memory arrays, such as 3-dimensional arrays of NOR memory strings ("3-D NOR memory arrays"), have been disclosed in, for example, U.S. Pat. No. 10,121,553 ("the '553 patent"), entitled "Capacitive-Coupled Non-Volatile Thin-film Transistor NOR Strings in Three-Dimensional Arrays," filed on Aug. 26, 2016, and issued on Nov. 6, 2018. The '553 patent disclosure is hereby incorporated by reference in its entirety for all purposes. In the '553 patent, storage transistors (or memory transistors) are organized as 3-dimensional arrays of NOR memory strings formed above a planar surface of a semiconductor substrate. In addition to providing high memory density and capacity, these 3-D NOR memory arrays may be operated to provide memory circuits at highly desirable speeds that rival conventional memory circuits of much lower circuit densities and significantly higher power dissipation, for example, such as dynamic random-access memories ("DRAMs").

Furthermore, the memory circuits in the '553 patent are sometimes referred to as "quasi-volatile memory." Like those of a non-volatile memory (NVM), the memory cells of a quasi-volatile memory each store a data bit as an electric charge in a charge storage material (e.g., ONO). Because of the nature of its charge-storage layer, a typical quasi-volatile memory cell has a much longer data retention time than a DRAM cell and, hence, requires a lower refresh rate than the DRAM cell. For example, a typical DRAM system is designed to be refreshed every 64 milliseconds; a quasi-volatile memory with a comparable effective access performance, however, may be refreshed every 10 minutes. The reduced refresh rate provides the quasi-volatile memory great advantages in a lower power requirement, a reduced heat dissipation, and a higher memory availability which delivers a better host performance.

Artificial intelligence and Big Data applications require memory performance where conventional system solutions are inadequate to provide. In particular, memory interfaces that can transfer a large amount of data from a storage device to a host system at reduced latency and high through-put is often needed to meet the demands of computing systems executing data intensive applications, such as Artificial intelligence and Big Data applications.

SUMMARY OF THE INVENTION

The present disclosure discloses a system and method for a high bandwidth memory interface implementing configurable high-speed serial data lanes, substantially as shown in and/or described below, for example in connection with at least one of the figures, as set forth more completely in the claims.

In one embodiment, a memory module includes a memory array of storage transistors; and a control circuit for accessing and operating the memory array. The control circuit includes a memory interface circuit where the memory interface circuit includes multiple transceivers, each transceiver to be connected to a respective serial data lane. The memory interface circuit configures a first subset of the transceivers for connecting through one or more serial data lanes to a host processor or connecting to transceivers of an upstream memory module and a second subset of the transceivers for connecting through one or more serial data lanes to transceivers of a downstream memory module.

In another embodiment, a memory device includes multiple memory modules, each memory module including a memory array of storage transistors and a control circuit for accessing and operating the memory array. The control circuit of each memory module includes a memory interface circuit where the memory interface circuit includes multiple transceivers, each transceiver to be connected to a respective serial data lane. The multiple memory modules are accessed by a host processor over a host serial link including a first number of serial data lanes. The multiple memory modules includes a first memory module and a second memory module. The memory interface circuit of the first memory module configures a first subset of the transceivers for connecting to the host processor and a second subset of the transceivers for connecting to transceivers of the second memory module through one or more serial data lanes.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 1, which includes

FIG. 2, which includes FIGS. 2(a), 2(b), and 2(c), illustrates memory modules including stacked memory dies in examples of the present invention.

FIG. 10, which includes FIGS. 10(*a*) and 10(*b*), illustrates a multi-module memory device in exemplary embodiments of the present invention.

DETAILED DESCRIPTION OF THE INVENTION

Figure 1A:
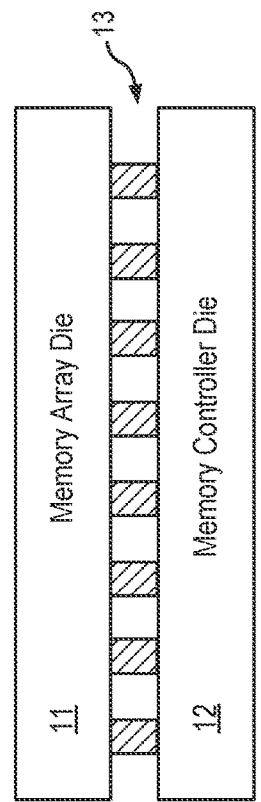
FIGS. 1(a), 1(b), 1(c), and 1(d), illustrates a memory module in examples of the present invention.
Figure 1B:
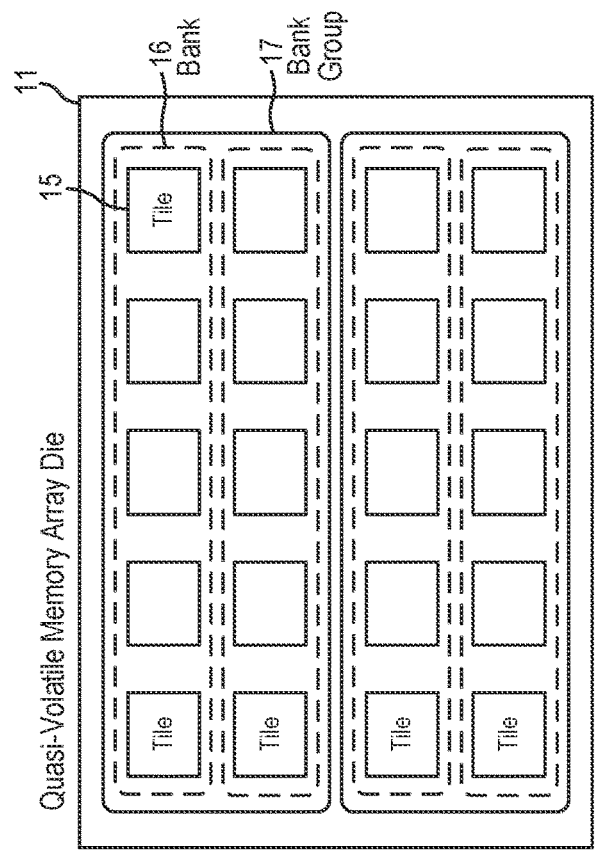
Figure 1C:
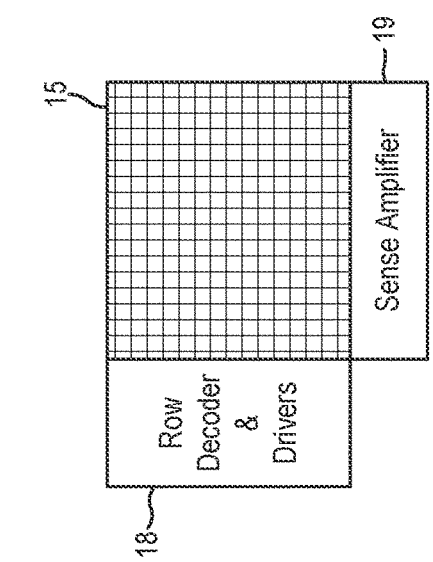
Figure 1D:
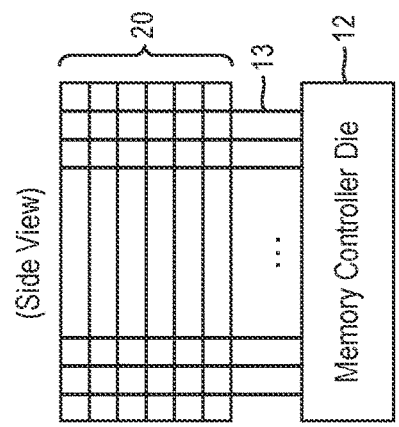

In embodiments of the present invention, a memory module including a memory array of storage transistors and a control circuit where the control circuit includes a memory interface for providing high bandwidth access to the memory array on serial data lanes. In some embodiments, the control circuit of a memory module includes multiple transceivers for connecting to serial data lanes. In one embodiment, the memory interface of a memory module configures some of the transceivers for host connection and configures other transceivers for connection to a downstream memory module. Data packets destined for the downstream memory module are transferred through the memory module on the serial data lanes. In other embodiments, a multi-module memory device is formed using multiple memory modules connected in a cascade configuration or in a star configuration to provide high bandwidth memory access to all memory locations of the multiple memory modules using the given number of serial data lanes of the host connection.

In embodiments of the present invention, a memory module may be implemented as a module or a circuit that integrates a memory die with a logic die (e.g., using hybrid bonding). In one example, the memory die is a quasi-volatile memory die. Configurations of quasi-volatile memory modules or circuits are disclosed, for example, in co-pending patent application Ser. No. 16/776,279, entitled "Device with Embedded High-Bandwidth, High-Capacity Memory using Wafer Bonding," filed on Jan. 29, 2020. The '279 Application is hereby incorporated by reference in its entirety.

FIG. 1, which includes FIGS. 1(*a*), 1(*b*), 1(*c*) and 1(*d*), illustrates a memory module in examples of the present invention. As disclosed in the '279 Application, a memory module may be built in a multi-die manner with at least one semiconductor die with a memory array ("memory die") and one semiconductor die with a memory controller ("controller die"), such as illustrated in FIG. 1(*a*). As shown in FIG. 1(*a*), a memory module 10 includes a memory die 11 and a controller die 12 interconnected by copper interconnect conductors ("hybrid bonds" or "studs") 13. In the present illustrations, copper studs are used in a flip chip bonding method to connect the memory die to the controller die. The large number of hybrid bonds provide a high-bandwidth data interface. In some embodiments, the memory die 11 is constructed using the 3-dimensional quasi-volatile memory arrays described in the '553 patent. For instance, the memory die 11 may be constructed as 3-dimensional arrays of NOR-type memory strings of thin-film storage transistors formed on a semiconductor substrate.

Referring to FIG. 1(*b*), in some embodiments, the memory die 11 includes multiple memory arrays of thin-film storage transistors where the memory arrays are organized as a 2-dimensional array of "tiles" (i.e., the tiles are arranged in rows and columns) formed above a planar semiconductor substrate. Each tile 15 can be configured to be individually and independently addressed or larger memory segments (e.g., a row of tiles or a 2-dimensional block of tiles) may be created and configured to be addressed together. In some examples, each row of tiles (a "tile row") may be configured to form an operating unit, which is referred to as a "bank" 16. A group of banks, in turn, form a "bank group" 17. In that configuration, the banks within a bank group may share data input and output buses in a multiplexed manner. As thus configured, the tile 15 is a building block that allows flexibility in configuring the memory module to adapt to application requirements. In the present description, the memory arrays in the memory die 11 are sometimes referred to as quasi-volatile memory circuits. In the present description, a bank may include one or more of tiles formed on the memory die 11.

As shown in FIG. 1(*c*), each tile 15 may also include row decoders and drivers 18, which activate word lines, each word line accessing a row of the memory cells within the tile. In one embodiment, within each tile are multiple columns of memory cells in multiple planes. The column decoders activate bit lines, with each bit line selecting a column of memory cells as well as a plane, such that, together with an activated word line, a memory cell is selected. In one embodiment, the memory cells within the planes in each column of memory cells share the same group of sense amplifiers within sense amplifiers 19. In one embodiment, the memory cells in the selected row form a "page" of memory cells that are sensed simultaneously and output by selecting the bit lines successively in a suitable group size (e.g., 8 bits ("byte") at a time). FIG. 1(*d*) shows that the bits of an activated page 20 are output to controller die 12 through studs 13. Any suitable page size (e.g., 1,024 or 2,048 bits) may be used.

It is instructive to note that FIGS. 1(*c*) and 1(*d*) are provided to illustrate the functional structure of the memory die and the memory module and the figures are not intended to illustrate the actual construction of the memory die or the memory module. In some embodiments, on the memory die 11, support circuitry for the memory array may be formed in the planar semiconductor substrate under the tiles. In one embodiment, the support circuitry for the thin-film storage transistors of each tile is provided for modularity in the portion of the semiconductor substrate underneath each tile. Examples of support circuitry include error-correction encoders and decoders, address decoders, power supplies, check-bit generators, sense amplifiers, word line drivers, and other circuits used in memory operations.

As described above, in embodiments of the present disclosure, a memory module includes a memory die 11 including memory arrays that are organized as a 2-dimensional array of tiles 15. In the present description, a "tile" in the memory module refers to an autonomous mini-array of memory cells within the memory arrays. More specifically, a tile in the memory circuit refers to one or more regular arrays of addressable modular structures or building blocks of memory cells placed in a regular manner. As thus configured, the memory circuit can be segmented into independently addressable memory segments. For example, a memory segment of a desired size (e.g., a row of 32 tiles) may be achieved by configuring a group of tiles to form the memory segment, as desired.

On controller die 12, a memory controller for accessing the memory arrays of memory die 11 is formed. The tile-based design of the memory die 11 naturally results in a modular organization of hybrid bonds to controller die 12, which leads to modularization of controller circuitry also. For example, the controller may adopt a design that is based on banks and bank groups to allow for simultaneous access to a large amount of data. Many variations of such a control scheme may be achieved by configuring data routing and control in the controller logic circuitry. Memory controllers die 12 may also include one or more external interfaces, such as memory interfaces for host access and other system functions, in addition to conventional memory controller functions. Alternatively, the memory control functions may be divided between memory die 11 and controller die 12 (e.g., some controller circuitry may be implemented on memory die 11). In that regard, the '279 Application discloses building a memory die using a process optimized for memory circuits and building a controller die using an advanced manufacturing process that is optimized for forming low-voltage and faster logic circuits. The controller die provides significant improvement over conventional circuitry that supports access to the memory arrays.

In one embodiment, the memory arrays on the memory die 11 is each an 8-layer (i.e., 8-plane) memory array which provides 8 pages of data with each activated row. If the number of layers is increased to 16, 16 pages of data are provided with each activated row without materially affecting the tile's footprint. With 4 planes and a 1024-bit page, each row in a tile has 4,096 bits. Of course, the number of rows in a tile may be adjusted for a greater or a lesser capacity to trade-off for a longer or a shorter access time, in accordance with the intended applications.

As described in the '279 Application, multiple memory dies may be stacked atop one upon another and interconnected for data routing among the memory dies by, for example, through-silicon vias ("TSVs"). The stacked memory dies require maintaining an internal regular topological and control structure. For example, the memory arrays in each memory die in the stack may be controlled according to an assign-and-select methodology. Such an organization readily lends to a design that allows each memory die in the stack to have full access to the high bandwidth hybrid bond interface to the controller die. In addition, a customizable design allows many variations to adapt to various application needs; such variations may be realized by suitably configuring the controller logic circuitry in the controller die. The resulting memory module has a high memory capacity accessible by a high bandwidth memory interface.

The memory module—which integrates at least one memory die and one controller die—results in faster memory controller operations and, thus, faster memory performance. In addition, as the memory die or dies and the controller die or dies may be separately fabricated under their respective specialized manufacturing processes, the memory module enables the high-capacity memory arrays of the memory dies to be accessible at a high bandwidth from high-density logic circuits in the controller die, leading to new capabilities not previously achievable in conventional memory circuits. By integrating memory and controller dies that are each configured and optimized for specific memory operations, the memory module may achieve reduced die size in each memory or controller die. The dies may be integrated using one or more integration techniques, including, for example, hybrid bonds, TSVs, exposed contacts and other suitable interconnect techniques for a very high interconnection density. The resulting advantage is especially significant when multiple memory dies are stacked to provide a high memory capacity, while sharing a memory controller among the multiple memory dies achieves a reduced cost-per-unit.

FIG. 2, which includes FIGS. 2(*a*), 2(*b*), and 2(*c*), illustrates memory modules including stacked memory dies in examples of the present invention. In embodiments of the present invention, a memory module may be formed by stacking two or more memory dies and integrating the stacked memory dies with a memory controller die, referred herein as a control circuit. FIG. 2(*a*) illustrates a memory module 30 including two memory dies 31-1 and 31-2 stacked and interconnected through through-silicon vias ("TSVs") 35. In some embodiments, each of the memory die 31 may be constructed as 3-dimensional arrays of NOR-type memory strings formed on a semiconductor substrate, such as the 3-dimensional memory arrays described in the '553 patent. The memory stack is then integrated with a controller die 32 ("control circuit"). The controller die 32 is sometimes referred to as a "control chiplet," referring to the control circuit being formed on its own semiconductor chip. In the present embodiment, the memory stack is interconnected to the control circuit 32 through TSVs 35. In other embodiments, other methods to interconnect the control circuit 32 to the memory stack may be used, such as hybrid bonds or copper studs, interposers or other suitable interconnect methods. The control circuit 32 includes memory interface circuit for communicating with a host processor, such as to receive commands and memory write data and to transmit memory read data.

FIG. 2(*b*) illustrates a memory module 40 including four memory dies 41-1 to 41-4 stacked on a control circuit 42 and interconnected through TSVs 45. Each of the memory die 41 may be constructed as 3-dimensional arrays of NOR-type memory strings formed over a semiconductor substrate. FIG. 2(*c*) illustrates the same stacked memory module 40 in a perspective view. By integrating multiple memory dies in the stack, a memory module 40 can realize a very high capacity memory circuit.

Figure 3:
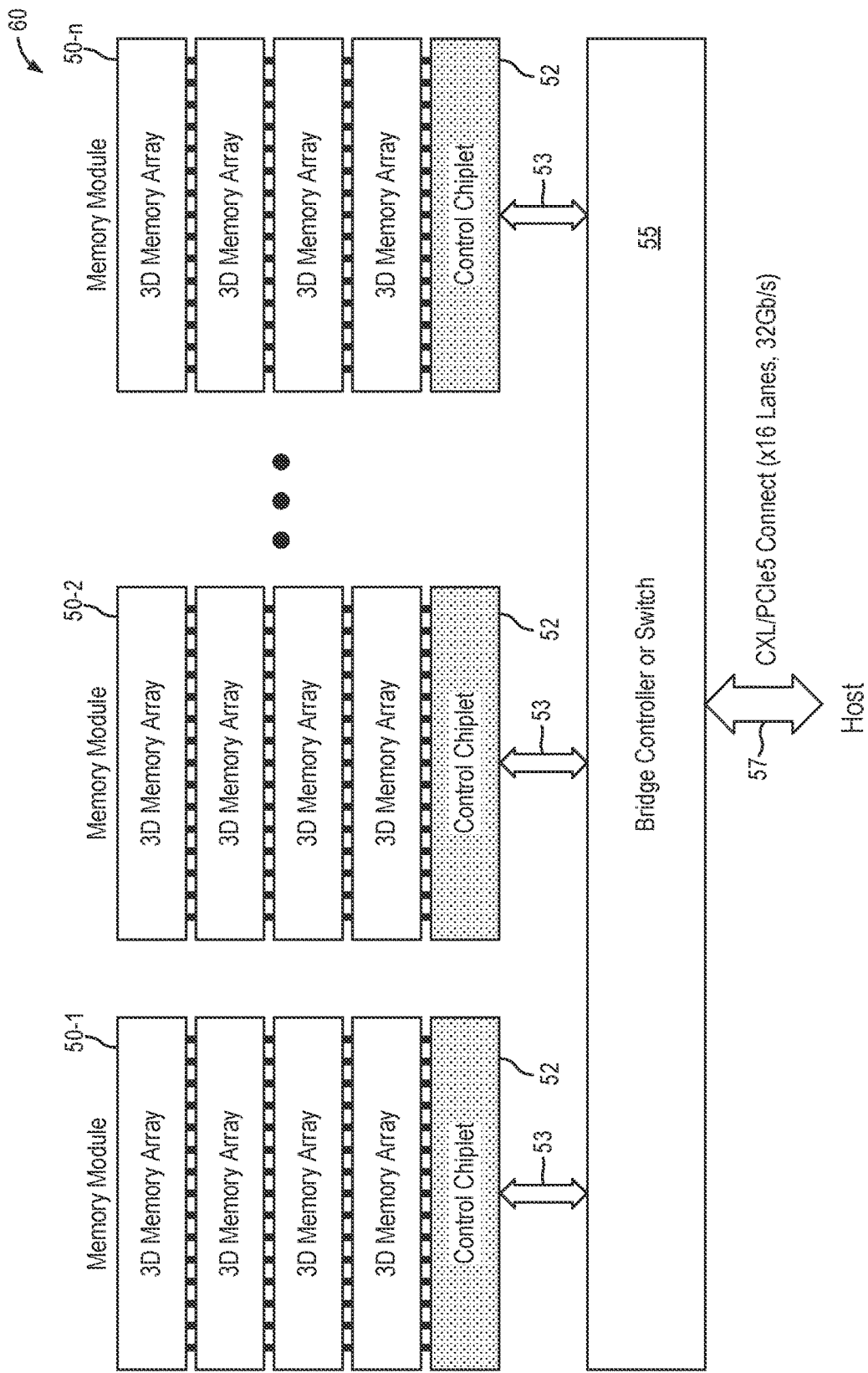
FIG. 3 is a schematic diagram of a multi-module memory device in some examples.

In some embodiments, a multi-module memory device is constructed using two or more memory modules. For example, a multi-module memory device may be constructed as a solid state drive and in communication with a host processor to transfer memory data. FIG. 3 is a schematic diagram of a multi-module memory device in some examples. Referring to FIG. 3, two or more memory modules 50 (such as modules 50-1 to 50-*n*) may be coupled together to form a multi-module memory device 60. In some examples, each memory module 50 may include one or more memory die 51 formed of 3-dimensional memory arrays. In one embodiment, each of the memory die 51 may be constructed as 3-dimensional arrays of NOR-type memory strings formed on a semiconductor substrate. The memory device 60 may be constructed to include two or more memory modules 50 interconnected to provide high bandwidth memory capability. At each memory module 50, memory data and commands are transferred into and out of the memory module 50 through a memory interface 53 implemented at the control circuit 52 ("control chiplet").

With each memory module 50 providing high memory capacity, a memory interface that enables high density and high bandwidth data transfer from each memory module is desired. Furthermore, the memory interface should minimize latency and power consumption and has the capability of maintaining high bandwidth capability to all memory locations in the memory array stack.

Figure 4:
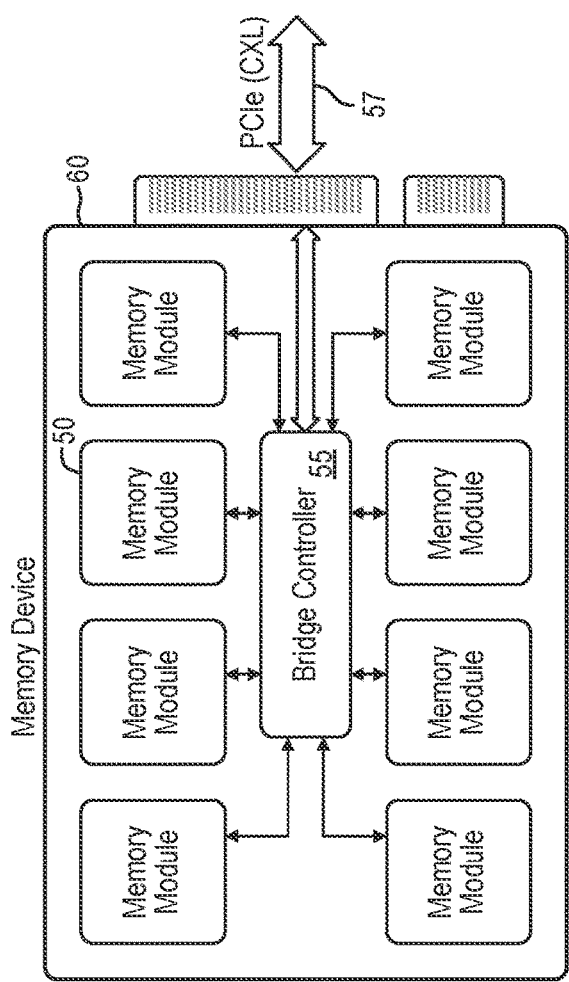
FIG. 4 illustrates an implementation of the multi-module memory device of FIG. 3 including a bridge controller in some examples.

In the present example, the multiple memory modules 50 are connected in parallel to a bridge controller or a switch 55 for providing high-speed high bandwidth data transfer between a host processor and the memory modules. FIG. 4 illustrates an implementation of the multi-module memory device of FIG. 3 including a bridge controller in some examples. As thus configured, each memory module 50 is connected to the bridge controller (or switch) 55 and the bridge controller 55 manages the flow of data and commands from the host processor over a serial bus 57 to each of the memory module 50.

In some examples, the bridge controller 55 is implemented as a SerDes (serializer/deserializer) switch connecting the memory modules 50 to the serial bus 57, such as a PCIe serial bus. In one example, the bridge controller 55 communicates with the host processor over the PCIe 5.0 serial bus using the CXL (Compute Express Link™) protocol. In the present example, the PCIe serial bus 57 includes 16 lanes of bidirectional signaling wires.

While the bridge controller 55 can be effective for implementing high bandwidth and high speed data transfer from the memory modules, the use of bridge controller 55 has some limitations. The bridge controller adds to the power consumption as well as introduces additional latency. The bridge controller, as a separate component, also add manufacturing cost to the multi-module memory device 60. In some cases, some CXL switches may have limited switch configurations which may lead to non-optimal configurations for the memory device. Furthermore, in some applications, the number of lanes in the serial bus for connection to the host processor may be limited and the high bandwidth data transfer from the multiple memory modules has to be maintained over the limited number of serial data lanes.

In embodiments of the present invention, a memory module implements a bridging memory interface incorporating configurable high-speed serial data lanes where some of the serial data lanes may be configured to bridge to one or more other memory modules. By using the bridging memory interface, multiple memory modules in a memory device may be interconnected to transfer data through the memory interface of each memory module and the use of a bridge controller or switch can be eliminated from the memory device. In some embodiments of the present invention, the bridging memory interface of the present invention is applied in a memory module including memory arrays that are constructed as 3-dimensional arrays of NOR-type memory strings formed on a semiconductor substrate. In one embodiment, the memory arrays are quasi-volatile memory arrays as disclosed in the '553 patent. The bridging memory interface of the present invention is particularly useful when applied to memory modules implemented using quasi-volatile memory arrays for enabling high speed and high bandwidth transfer of memory data from the memory modules having high memory density.

In other embodiments, the bridging memory interface of the present invention can be applied to memory modules of other types of memories, such as DRAMs or SRAMs or ferroelectric memory arrays or other memory types, including volatile and non-volatile memories. In the following description, references to "a memory module" or "memory modules" refer to a memory module of any memory types. References to a memory module with quasi-volatile memory arrays are illustrative only and not intended to be limiting. The bridging memory interface of the present invention may be incorporated in memory modules implemented using any memory types. In the present description, a quasi-volatile memory array refers to an array of quasi-volatile memory cells where the quasi-volatile memory cells have a much longer data retention time than DRAM cells and requiring a lower refresh rate than DRAM cells. For example, a typical DRAM cell may need to be refreshed every 32 milliseconds (at high temperature); a quasi-volatile memory with a comparable effective access performance, however, may be refreshed every 10 minutes.

Furthermore, in the present description, a "memory module" refers to a memory array and the associated control circuit, sometimes referred to as memory control circuit or memory controller circuit. The memory array may include one or more two-dimensional or three-dimensional arrays of storage transistors, also referred to as memory cells, for storing memory data. The control circuit includes circuitry for accessing and operating the memory arrays and other memory control functions, such as data routing and error correction. The control circuit may also include one or more external interfaces, such as a memory interface for host access and other system functions. The memory module may be a multi-die structure with the memory array formed on one semiconductor die and the control circuitry formed on a separate semiconductor die. The memory die and the memory controller die may be integrated using a variety of integration techniques, such as using TSVs, hybrid bonds, exposed contacts, interposers, printed circuit boards and other suitable interconnect techniques, especially techniques for high density interconnects. The memory controller die is sometimes referred herein as a control circuit. In some embodiments, the memory module may also be formed as a monolithic device on a single semiconductor die. In one example, the memory array may be a three-dimensional thin film transistor array formed over a semiconductor substrate and the control circuit may be formed in the semiconductor substrate under the three-dimensional thin film transistor array.

As described above, the specific memory type or the configuration of the memory module is not critical to the practice of the present invention. The bridging memory interface can be incorporated in the memory control circuit or memory controller circuit of a memory module implemented using any memory type or implemented using any memory architecture. In one embodiment, the bridging memory interface is implemented in a memory module including storage transistors that are organized as three-dimensional arrays of NOR memory strings. In the present description, a NOR-type memory string includes storage transistors formed above a planar surface of a semiconductor substrate that share a common source region and a common drain region, where each storage transistor can be individually addressed and accessed. In some examples, a three-dimensional array can be formed with the NOR memory strings provided on multiple planes (e.g., 8 or 16 planes) above the semiconductor substrate, with the NOR memory strings on each plane arranged in rows.

In some examples, the storage transistors in the NOR memory strings are charge-trap type storage transistors. For a charge-trap type storage transistors, data is stored in a charge storage film in each storage transistor. For examples, the charge storage film includes a tunneling dielectric layer, a charge trapping layer and a blocking layer, which can be implemented as a multilayer including silicon oxide, silicon nitride, and silicon oxide, arranged in this order and referred to as an ONO layer. An applied electrical field across the charge storage film adds or removes charge from charge traps in the charge trapping layer, altering the threshold voltage of the storage transistor to encode a given logical state to the storage transistor.

In another example, the storage transistors in the NOR memory strings are ferroelectric field effect transistors including a ferroelectric thin film as the gate dielectric layer (e.g. hafnium oxide). In a ferroelectric field effect transistor (FeFET), the polarization direction in the ferroelectric gate dielectric layer is controlled by an applied electric field at the transistor drain terminal where changes in the polarization direction alters the threshold voltage of the FeFET. For example, the FeFET may be programmed to have either one of two threshold voltages, where each threshold voltage of the FeFET can be used to encode a given logical state.

Figure 5:
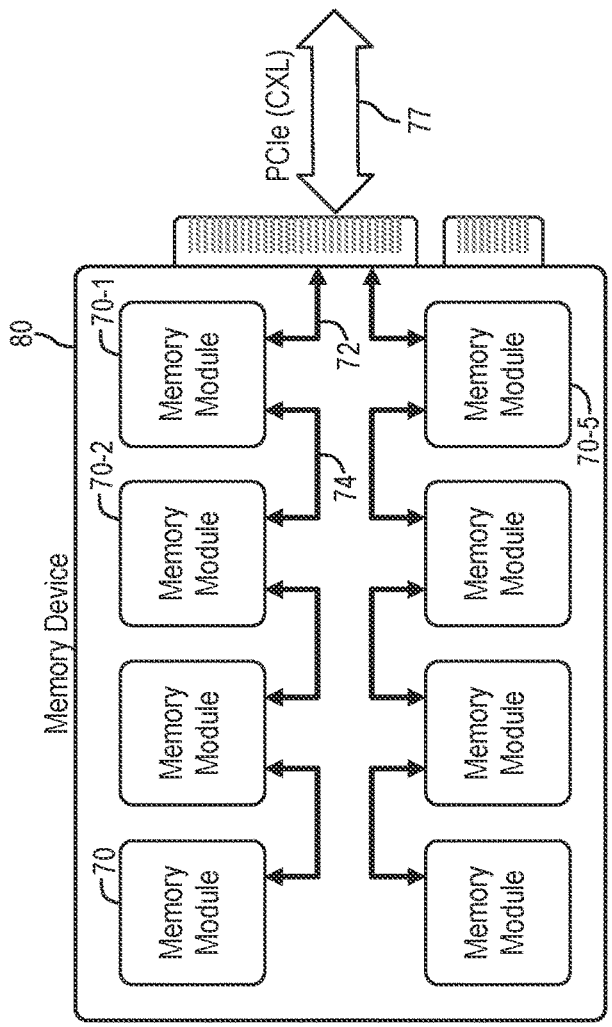
FIG. 5 is a schematic diagram of a multi-module memory device including memory modules incorporating the bridging memory interface in embodiments of the present invention.

FIG. 5 is a schematic diagram of a multi-module memory device including memory modules incorporating the bridging memory interface in embodiments of the present invention. Referring to FIG. 5, in the present example, a multi-module memory device 80 includes eight memory modules 70. Each of the memory module 70 includes a memory control circuit that implements the bridging memory interface in accordance with embodiments of the present invention. The bridging memory interface on one memory module 70 may configure some of its serial data lanes ("serial lanes") to bridge or connect to another memory module 70. In the example shown in FIG. 5, the eight memory modules 70 are divided into two groups and each group of memory modules 70 are configured in a cascade configuration. That is, a first memory module 70-1 includes serial lanes 72 that are connected to the host processor and includes back-channel serial lanes 74 that are bridged or connected to another memory module 70-2. The memory module 70-2 further includes back-channel serial data lanes that connect to another memory module down the chain. In the present example, a chain of four memory modules are bridged or connected using the configurable serial lanes of the bridging memory interface. Data transfer from each of the memory modules in the chain are propagated through the serial lanes and onto serial lanes 72 for access by the host processor.

The bridging memory interface of the present invention is particularly useful in systems where a memory device communicates with a host processor over a point-to-point interface. In one example, the point-to-point interface is a serial interface. In another example, the point-to-point interface is a serial interface implemented over high speed serial data links. In a system where the memory device interfaces with the host processor using a point-to-point interface, it is not possible to connect multiple memory modules in parallel through the point-to-point interface. The bridging memory interface of the present invention allows multiple memory modules to be cascaded while utilizing the same point-to-point interface to communicate with the host processor.

The bridging memory interface of the present invention with configurable serial data lanes for bridging to other memory module realizes many advantages. First, the bridging memory interface of the present invention enables full-bandwidth access to all of the linked memory modules, while minimizing the number of lanes of the serial bus needed for host connection. The bridging memory interface is thus advantageous for applications with limited host resources, such as limited number of PCIe lanes for host connection. Second, the bridging memory interface of the present invention eliminates the needs for additional components, such as a bridge controller or a switch, thereby reducing cost and size of the memory device implementation. Third, the bridging memory interface of the present invention reduces the average latency for data transfer as compared to routing the memory data through a bridge controller or a switch. Lastly, the bridging memory interface of the present invention reduces the average power consumption as compared to routing the memory data through a bridge controller or a switch.

Figure 6:
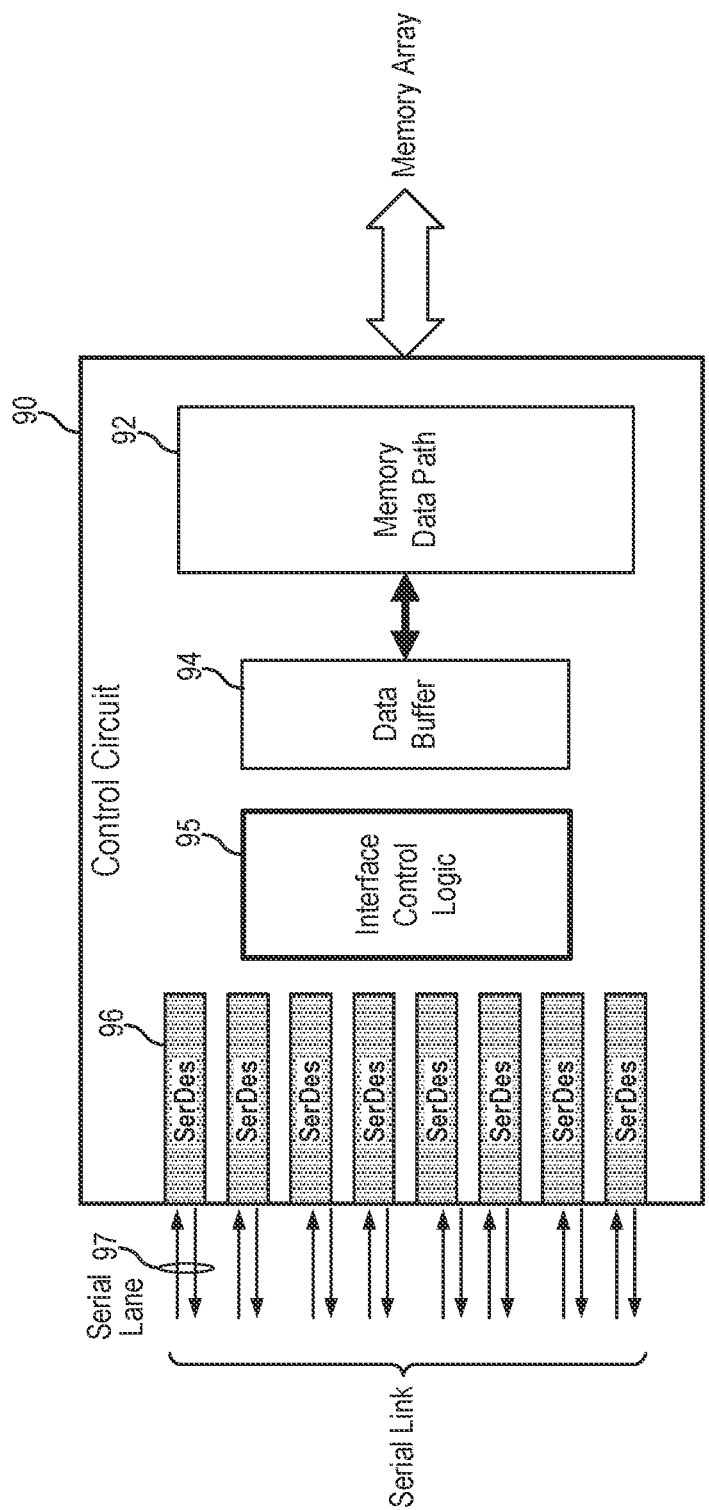
FIG. 6 is a schematic diagram of a control circuit of a memory module incorporating a bridging memory interface implementing configurable high-speed serial lanes in embodiments of the present invention.

FIG. 6 is a schematic diagram of a control circuit of a memory module incorporating a bridging memory interface implementing configurable high-speed serial lanes in embodiments of the present invention. In the present description, the control circuit is illustrated as including only elements relating to the memory interface to simplify the discussion. In actual implementation, the control circuit includes other elements not shown in FIG. 6 to provide the control functions for operating the memory array. For example, the control circuit may include other circuit elements for operating the storage transistors in the memory array of the memory module, such as address translation, error correction, refresh control and other memory operation functions. In one embodiment, the memory module is a multi-die memory module, such as the memory module shown in FIG. 2, and the control circuit 90 is formed in the control chiplet of the memory module.

Referring to FIG. 6, a control circuit 90 in a memory module includes a memory data path circuit 92 for communicating with the associated memory array. The control circuit 90 further includes a data buffer 94 for storing data in transit and an interface control logic circuit 95 for implementing the control functions of the memory interface. The control circuit 90 further includes a set of transceivers 96, also referred to as "SerDes" in the present description. Each transceiver 96 includes a transmitter and a receiver for connecting to respective serial lane 97. In the present description, a serial lane 97 includes a pair of signaling wires for the transmitting and receiving directions. In some embodiment, each signaling wire may be a single line or may be a differential pair. In the present description, a set of serial lanes 97 is referred to as a "serial link" for connecting from one device (the control circuit) to another device (another control circuit or to the host processor), as will be described in more details below. In the present description, the serial lanes 97 is representative of a type of point-to-point interface. In the present description, the bridging memory interface includes the data buffer 94, the interface control logic circuit 95 and the transceivers 96. It is instructive to note that the data buffer 94 may be an element shared by other functions of the control circuit and does not need to be a dedicated buffer storage for the memory interface.

Each transceiver 96 ("SerDes") includes a transmitter for transmitting data onto the signaling wire of the respective serial lane 97 and a receiver for receiving data from the signaling wire of the respective serial lane 97. The transceiver 96 further includes a serializer and a deserializer for converting data between serial data and parallel data in each direction. The transceiver 96 is therefore also referred to as a SerDes, denoting a Serializer/Deserializer. In some embodiments, the transmitter in the transceiver 96 includes a serializer implemented as a Parallel In Serial Out (PISO) circuit, also referred to as Parallel-to-Serial converter. The transmitter receives the parallel data from the data buffer 94 and provides serial data output onto the signaling wire in serial lane 97. Furthermore, the receiver in the transceiver 96 includes a deserializer implemented as a Serial In Parallel Out (SIPO) circuit, also referred to as Serial-to-Parallel converter. The receiver receives serial data from the signaling wire in serial lane 97 and provides parallel data to be stored in the data buffer 94. In the present embodiment, the memory interface transfers data in a data packet format, where the data packets may contain commands, memory address, memory data and control information.

The interface control logic circuit 95 controls the operation of the memory interface, including managing the data transfer between the data buffer and the transceivers 96. In some embodiments, the interface control logic circuit 95 manages the configuration of the transceivers 96 for upstream or downstream connections, as will be described in more details below. In particular, the interface control logic circuit 95 manages the negotiation with other devices connected to the serial lanes of the control circuit, such as negotiating with the host processor or with the memory interface of another memory module. As a result of the negotiation, the interface control logic circuit 95 determines the configuration of the memory interface and operates the memory interface accordingly.

In the present embodiment, the memory interface of the control circuit 90 includes eight transceivers 96 for connecting to eight serial lanes 97. This is illustrative only and not intended to be limiting. The control circuit 90 may be provided with a suitable number of transceivers based on the application of the memory module or the multi-module memory device and the host resource requirements. In other embodiments, the control circuit 90 may include 2, 4, 8 or 16 transceivers 96. The use of even numbers of transceivers is not required but is useful for dividing the transceivers into upstream or downstream connections, as will be described in more details below.

Figure 7B:
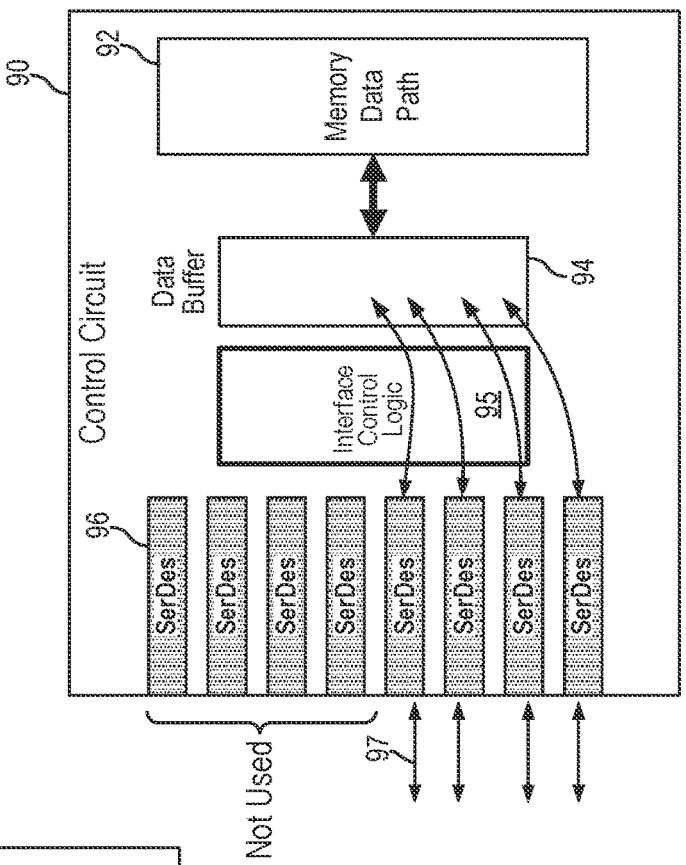
FIG. 7, which includes FIGS. 7(*a*) and 7(*b*), illustrates the configuration of the memory interface in the local mode in exemplary embodiments of the present invention.
Figure 7A:
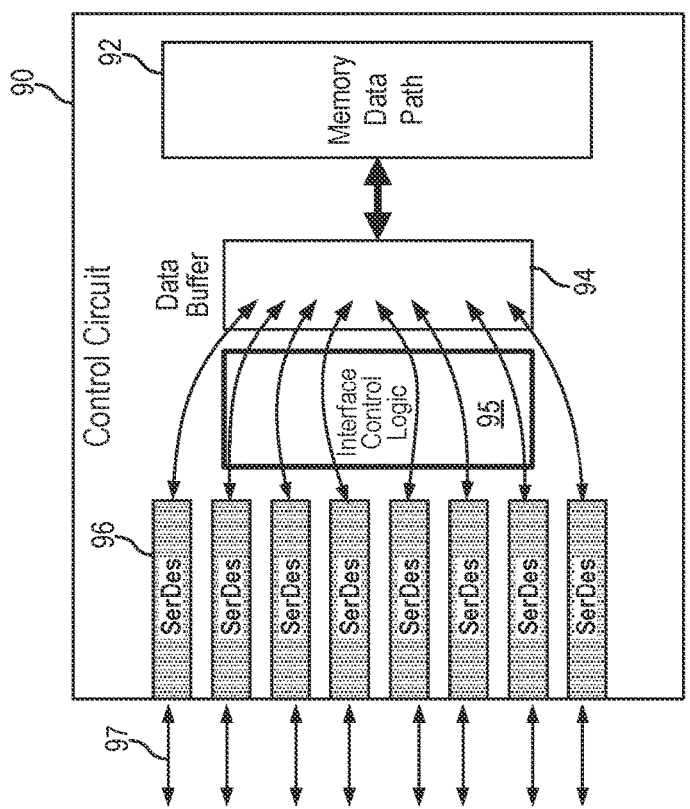

In operation, the memory interface in the control circuit 90 may be configured in a local mode or a bridging mode of operation. In the local mode, some or all of the serial lanes 97 of the memory interface are connected for transferring data from the memory array coupled to the control circuit. FIG. 7, which includes FIGS. 7(*a*) and 7(*b*), illustrates the configuration of the memory interface in the local mode in exemplary embodiments of the present invention. It is instructive to note that in FIG. 7 and subsequent figures, the serial lane is illustrated with a single double arrow line to simplify the drawings. It is understood that each serial lane includes a pair of signaling wires for the transmitting and receiving directions, where each signaling wire can be a single line or a differential pair of signal lines. Referring to FIG. 7(*a*), in some embodiments, all eight transceivers 96 of the memory interface has been configured for transferring data from the locally connected memory array only. For example, the serial lanes 97 may be connected to a host processor. Upon power up, the interface control logic circuit 95 performs negotiation with device(s) connected to the eight serial lanes 97 and determines that all eight lanes have been configured to connect to the host processor. Referring to FIG. 7(*b*), in some cases, only some of the transceivers 96 are configured for use and other transceivers remain unconnected. For example, the serial lanes of four of transceivers 96 may be connected to a device (such as a host processor or another control circuit). In that case, upon power up, the interface control logic circuit 95 performs negotiation with device(s) connected to the eight serial lanes 97 and determines that four lanes have been configured to connect to a device, such as a host processor, and the other four lanes are unconnected and unused.

In either of the configurations in FIGS. 7(*a*) and 7(*b*), the control circuit may receive read data from the memory array at the memory data path 92. The read data may be stored in data buffer 94 pending transmission. The interface control logic 95 manages the transmission of the read data from the data buffer 94 onto the transceivers 96. The transceivers 96 that are connected to the host processor provides read data in the form of data packets onto the serial lanes 97. For write operation, data packets containing memory address, write command and write data are received at the transceivers 96 and converted to parallel data which may be stored in data buffer 94. The memory address, write command and write data are then provided to the memory data path 92 to access the respective storage transistors in the memory array and to store the write to the designated storage transistors.

Figure 8:
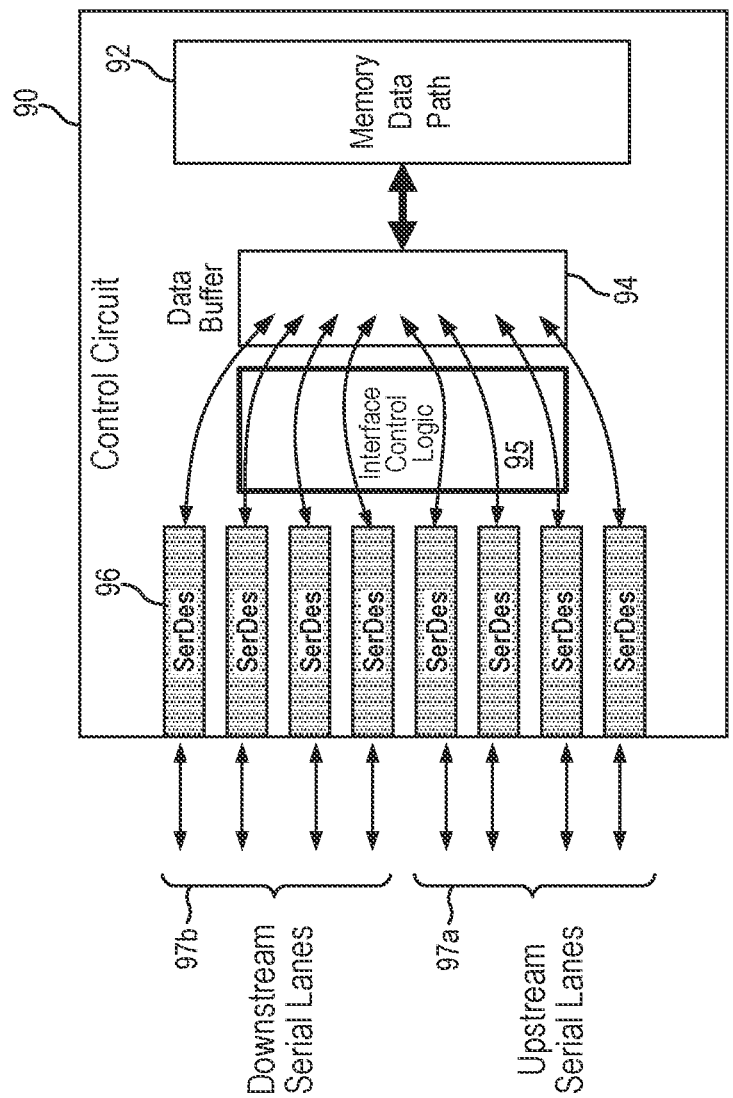
FIG. 8 illustrates the configuration of the memory interface in the bridging mode in exemplary embodiments of the present invention.

In other embodiments, the memory interface in the control circuit 90 may be configured in the bridging mode. In the bridging mode, some of the serial lanes 97 of the memory interface are configured as upstream serial lanes and some of the serial lanes are configured as downstream serial lanes. In the present description, the "upstream" direction refers to a direction of data flow to the host and the "downstream" direction refers to a direction of data flow away from the host. FIG. 8 illustrates the configuration of the memory interface in the bridging mode in exemplary embodiments of the present invention. Referring to FIG. 8, in the bridging mode, the memory interface is configured for transferring data from the locally connected memory array as well as for passing data for one or more other memory modules connected thereto. In the embodiment shown in FIG. 8, a first group of transceivers 96 is connected to upstream serial lanes 97*a* and a second group of transceivers 96 is connected to downstream serial lanes 97*b*. In one example, the upstream serial lanes 97*a* may be connected to a host processor and the downstream serial lanes 97*b* may be connected to another memory module. In that case, upon power up, the interface control logic 95 performs negotiation with device(s) connected to the eight serial lanes 97 and determines that four of the serial lanes are connected to the host processor and the other four serial lanes are connected to the memory interface of another control circuit. In that case, the memory interface uses the four upstream serial lanes for transferring data packets from locally connected memory array to and from the host processor. The memory interface uses the four downstream serial lanes to receive or to pass data packets to the memory module connected thereto. For example, the memory interface may pass data packets received from the host processor not designated for its own memory array to the connected memory module through the downstream serial lanes. On the other hand, the memory interface may receive data packets from the connected memory module (or "remote memory module") on the downstream serial lanes and re-transmit the data packets to the host processor on the upstream serial lanes. In some cases, the data packets may be stored temporarily on the data buffer 94 pending transmission onto the respective serial lanes. As thus configured, four serial lanes are connected to the host processor and any memory location on the local memory arrays or the remote memory arrays has access to full four-lane bandwidth for transmission with the host processor.

Figure 9:
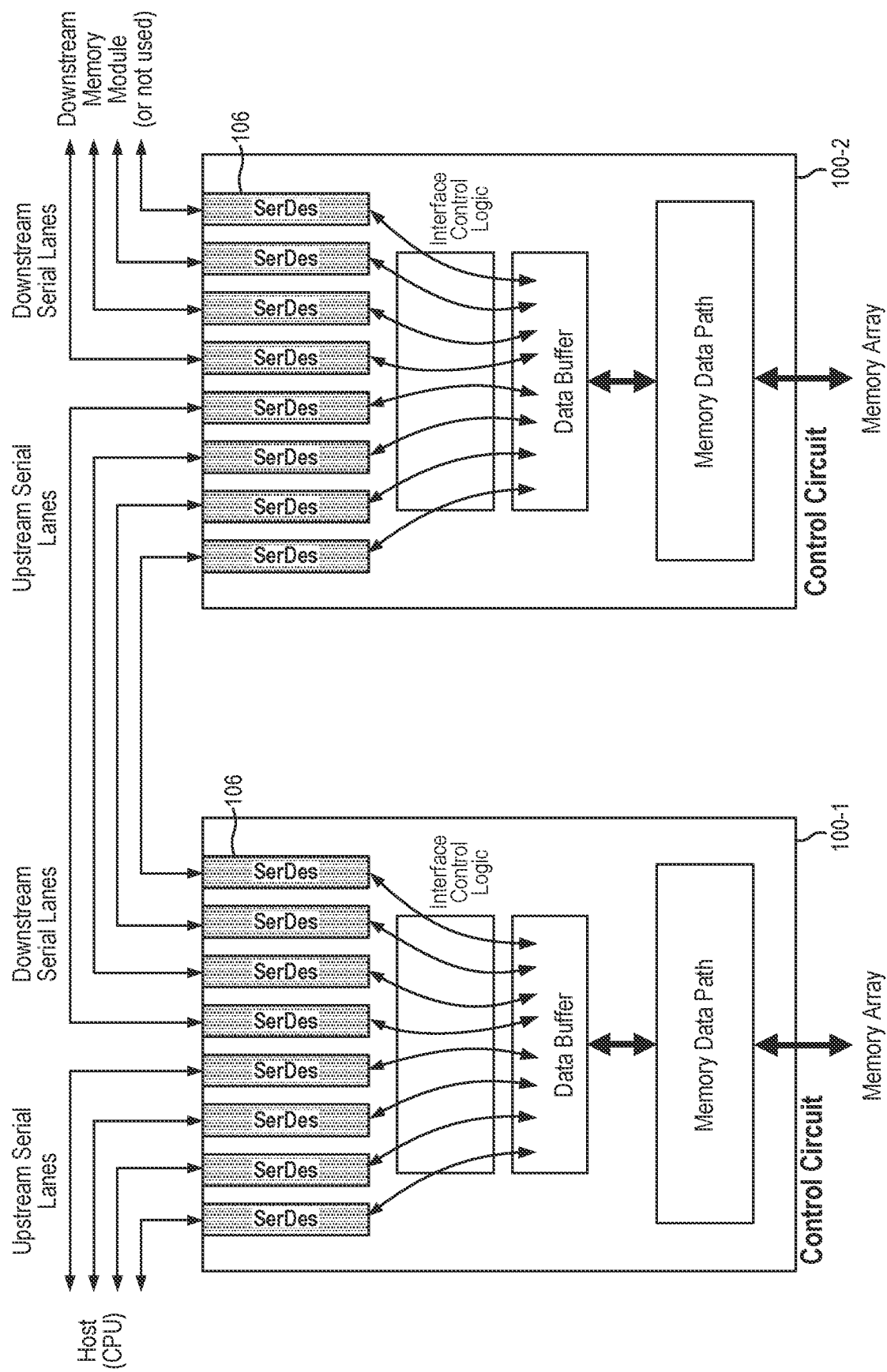
FIG. 9 illustrates the connection of serial lanes between a pair of memory modules in exemplary embodiments of the present invention.

FIG. 9 illustrates the connection of serial lanes between a pair of memory modules in exemplary embodiments of the present invention. Referring to FIG. 9, control circuits 100-1, 100-2 for a pair of memory modules are configured in the same manner and each includes eight transceivers 106. It is understood that each control circuit is connected to an associated memory array including one or more memory dies (not shown). Each control circuit 100 communicates with the memory array through the memory data path. The memory interface for each control circuits configures a first group of four transceivers 106 as upstream serial lanes and a second group of four transceivers 106 as downstream serial lanes. The upstream serial lanes of the first control circuit 100-1 is connected to the host processor. The control circuit 100-1 that connects to the host processor is sometimes referred to as the front control circuit. The downstream serial lanes of the first control circuit 100-1 is connected to the upstream serial lanes of the second control circuit 100-2. In this manner, the control circuit 100-2 is bridged to the front control circuit 100-1 for connection to the host processor. The downstream serial lanes of the control circuit 100-2 may be connected to other the control circuits of another memory module. Alternately, the downstream serial lanes of the control circuit 100-2 may be unused if no other memory modules are to be connected. As thus configured, both control circuits 100-1 and 100-2 uses the upstream serial lanes of the front control circuit 100-1 to transfer data packets to the host processor. The control circuit 100-2 receives data packets destined for its own memory array through the front control circuit 100-1.

In some embodiments, to connect memory modules in a cascaded manner, the bridging memory interface on a control circuit includes a number of transceivers being two times the number of serial lanes of the host connection. That is, if the host connection has four serial lanes, then the bridging memory interface includes eight transceivers to be connected to up to eight serial lanes. As thus configured, data transfer from any of the cascaded memory modules connected by the bridging memory interface occurs at the full bandwidth of the host connection.

In the above described embodiments, the control circuit is shown as including eight transceivers to be connected to up to eight serial lanes. The use of eight transceivers is illustrative only and not intended to be limiting. As described above, the number of transceivers in the control circuit is selected based on applications and the number of transceivers in the control circuit may be 2 or more. In typical applications, the control circuit includes 4, 8 or 16 transceivers connecting to 4, 8 or 16 serial lanes.

FIG. 10, which includes FIGS. 10(a) and 10(b), illustrates a multi-module memory device in exemplary embodiments of the present invention. Referring to FIG. 10, a multi-module memory device 120 includes two memory modules 110 formed on a printed circuit board. In the present illustration, the memory modules 110 are shown with only the control circuit for each memory module. It is understood that each control circuit is coupled to an associated memory array including one or more memory dies (not shown). The memory device 120 is configured with four serial lanes 117 for connection to a host, such as a host processor, a server or a graphical processor. In the present example, the serial lanes 117 may be configured as PCIe 5.0 bus over CXL protocol. In one example, the serial lanes 117 provide 16 GB/s each for read and write operations. The host connection defines the full bandwidth of the memory device 120 which is the serial lanes 117 in the present example.

The memory module 110 are configured in a cascade manner with memory module 110-1 being the near memory module and the memory module 110-2 being the far memory module. Each memory interface includes two times four or eight transceivers connecting to up to eight serial lanes. The four upstream serial lanes of the near memory module 110-1 are connected to the serial lanes 117 for connection to the host. The four downstream serial lanes of the near memory module 110-1 are connected to the four upstream serial lanes of the far memory module 110-2. The four downstream serial lanes of the far memory module 110-2 are not used in this example. As thus configured, both memory modules 110-1, 110-2 have access to the full bandwidth of the host connection—that is, both memory modules have access to the four serial lanes 117 for connection to the host. The access by the far memory module 110-2 may experience a small additional latency as compared to the near memory module 110-1.

FIG. 10 further illustrates the data flow in a read operation in the multi-module memory device 120 in some examples. Referring to FIG. 10(a), when a read operation to the far memory module 110-2 is performed, read data from the memory array of the far memory module 110-2 is retrieved and may be stored in the data buffer of the memory interface on the control circuit before being transferred out onto the four upstream serial lanes. The control circuit of the near memory module 110-1 receives on the downstream serial lanes the data packets containing the read data from the far memory module 110-2. The control circuit of the near memory module 110-1 recognizes that any data packets received on the downstream serial lanes are to be passed to the host connection. The memory interface on the control circuit of the near memory module 110-1 may store the received data packets in the data buffer temporarily and passes the data packets onto its upstream serial lanes to be transmitted to the host processor via the serial lanes 117.

Referring to FIG. 10(b), when a read operation to the near memory module 110-1 is performed, read data from the memory array of the near memory module 110-1 is retrieved and may be stored in the data buffer of the memory interface on the control circuit before being transferred out onto the four upstream serial lanes directly to the host processor via the serial lanes 117. In this case, the downstream serial lanes of the memory interface of the near memory module 110-1 are inactive.

In embodiments of the present invention, the multi-module memory device 120 can be operated to use the address space of the near memory module 110-1 for storing "hot" data and to use the address space of the far memory module 110-2 for storing "cold" data. In the present description, "hot" data refers to data that is frequently accessed and "cold" data refers to data that is infrequently or rarely accessed. The near memory module can be accessed without additional latency and is therefore suitable for storing frequently accessed data whereas the far memory module has a small additional latency and is therefore suitable for data that may not be frequently accessed. In some embodiments, the host processor maintains the address space available for storing hot data versus cold data and issues command to the memory device to instruct the memory device to store data in the desired address space. For example, the host processor issues command to the memory device 120 to store data in the address space of the near memory module 110-1 where the data is expected to be frequently accessed. The near memory module has shorter access time and can function as a cache memory. In another example, the host processor issues command to the memory device 120 to store data in the address space of the far memory module 110-2 where the data is expected to be infrequently accessed. The far memory module may have a longer access time than the near memory module.

Figure 11:
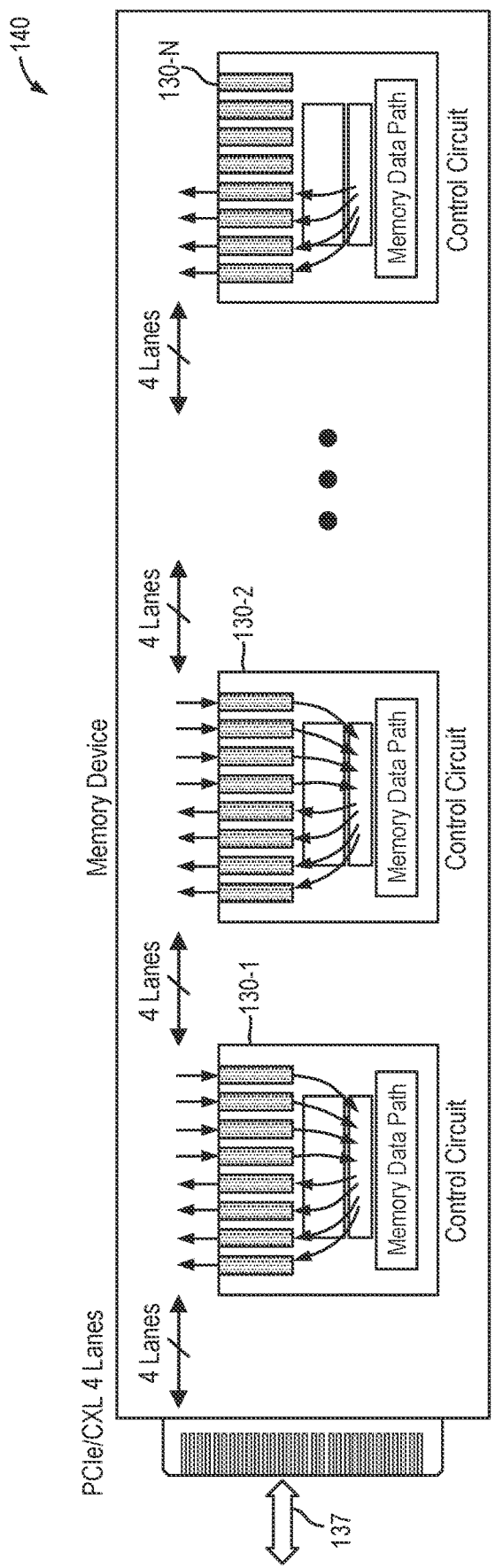
FIG. 11 illustrates a multi-module memory device in an alternate embodiment of the present invention.

In embodiments of the present invention, the bridging memory interface enables multiple memory modules to be connected in a cascade configuration to realize a memory device with high capacity. In particular, cascading the memory modules using the bridging memory interfaces allows all of the memory locations across all the memory modules to be accessible from the host connection. FIG. 11 illustrates a multi-module memory device in an alternate embodiment of the present invention. Referring to FIG. 11, a multi-module memory device 140 is formed including N number of memory modules 130 on a printed circuit board. The memory device 140 is configured with four serial lanes 137 for host connection to a host. In the present example, the serial lanes 137 may be configured as PCIe 5.0 bus over CXL protocol. The full bandwidth of the memory device 140 is the four serial lanes 137. By cascading N number of memory modules 130 using the bridging memory interfaces on the control circuits of each memory module, the memory device 140 can achieve very high densities while all memory modules are able to operate at the full bandwidth of the host connection (4 serial lanes 137). As thus configured, a very high density memory device is realized while consuming few host resources.

Figure 12:
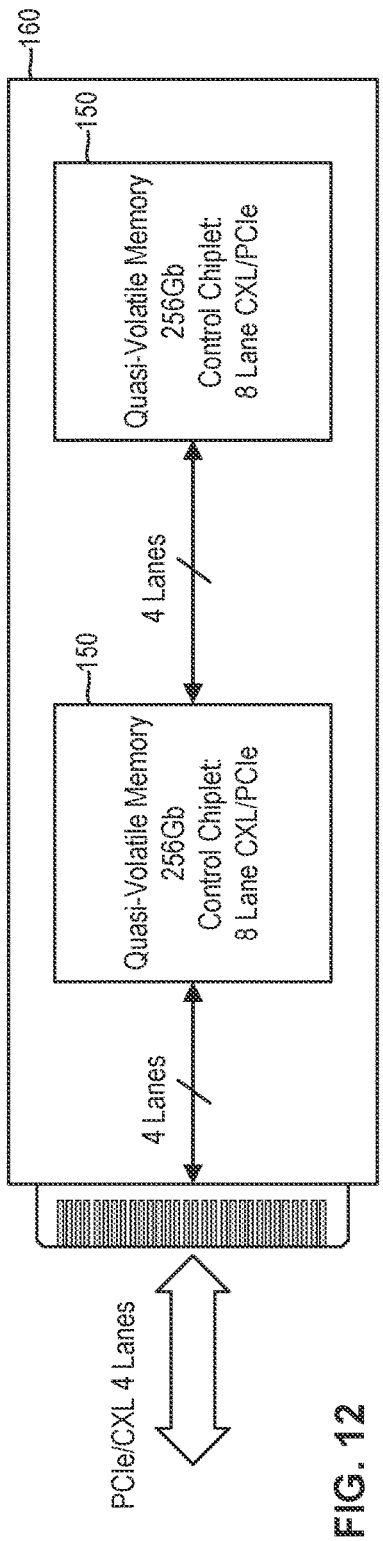
FIG. 12 illustrates an exemplary multi-module memory device implemented using quasi-volatile memory modules in some embodiment of the present invention.

FIG. 12 illustrates an exemplary multi-module memory device implemented using memory modules in some embodiment of the present invention. Referring to FIG. 12, a multi-module memory device 160 is a 64 GB memory provided over 4 lanes of PCIe bus over CXL protocol. The 4 lanes of PCIe bus is also referred to as the output bus of the memory device 160. The multi-module memory device 160 is constructed using two 256 Gb quasi-volatile memory modules 150, each quasi-volatile memory module being constructed with a control chiplet including 8 transceivers connecting up to 8 serial lanes. Accordingly, the front memory module has four transceivers connected to the 4 serial lanes output bus and has four transceivers connected to the upstream serial lanes of the back memory module. The back memory module has four transceivers that are not connected.

Figure 13:
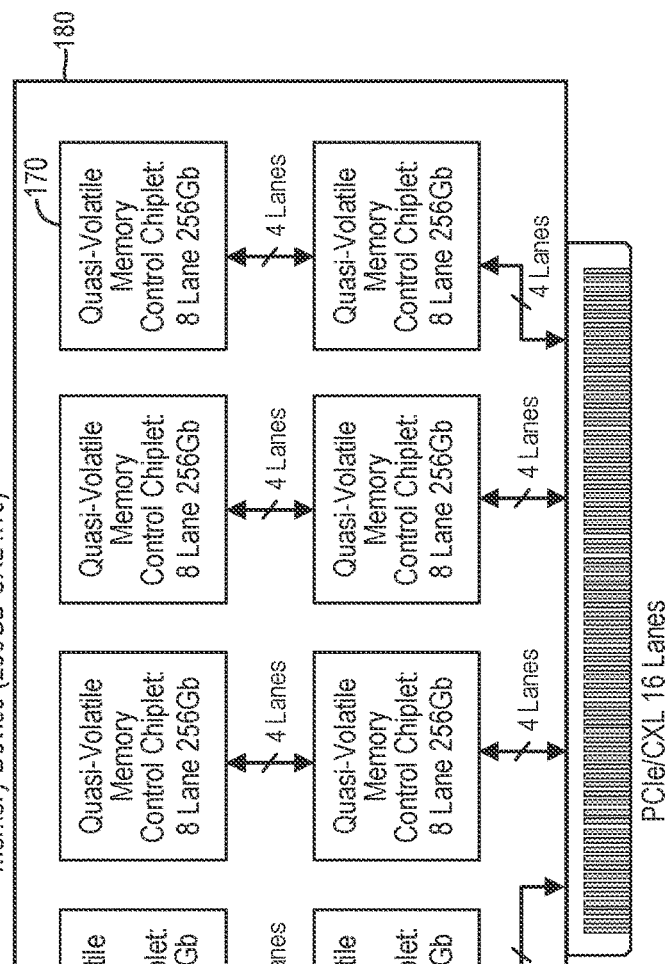
FIG. 13 illustrates an exemplary multi-module memory device implemented using quasi-volatile memory modules in alternate embodiment of the present invention.

FIG. 13 illustrates an exemplary multi-module memory device implemented using quasi-volatile memory modules in alternate embodiment of the present invention. Referring to FIG. 13, a multi-module memory device 180 is a 256 GB memory provided over 16 lanes of PCIe bus over CXL protocol. The 16 lanes of PCIe bus is also referred to as the output bus of the memory device 180. The multi-module memory device 180 is constructed using eight quasi-volatile memory modules 170, each quasi-volatile memory module being constructed with a control chiplet including 8 transceivers connecting up to 8 serial lanes. In the present configuration, the eight memory modules are divided into four groups of two cascaded memory modules. Each group of cascaded memory modules connects to four lanes of the 16-lane output bus.

FIGS. 12 and 13 illustrate different configurations of the multi-module memory device that can be constructed using the bridging memory interface of the present invention depending on the desired memory density and the bandwidth of the output bus to be provided.

Figure 14:
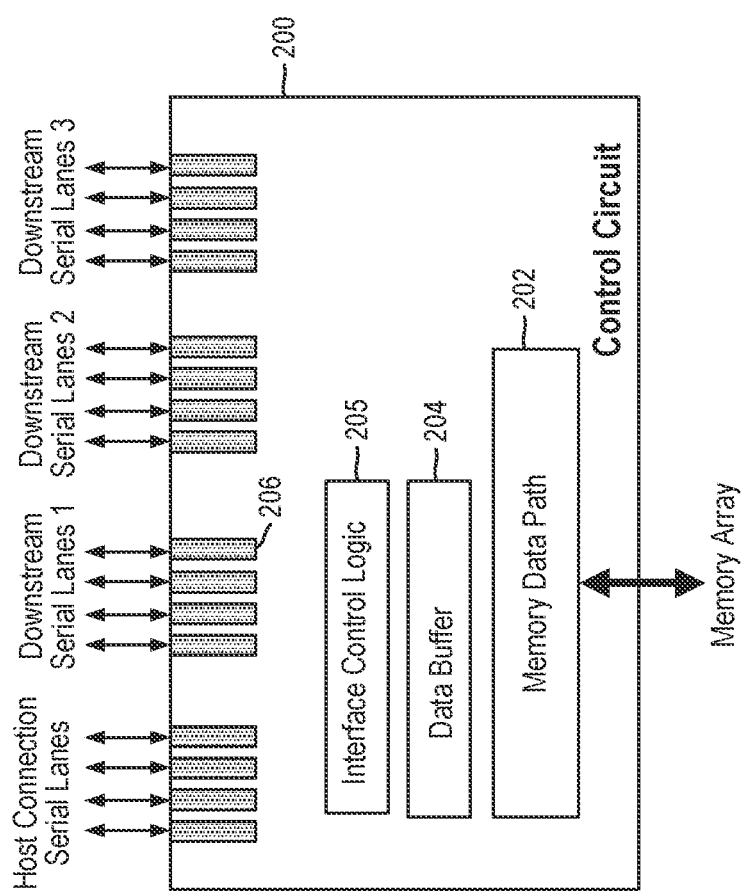
FIG. 14 is a schematic diagram of a control circuit incorporating a bridging memory interface implementing configurable high-speed serial lanes in alternate embodiments of the present invention.

In the embodiments described above, when the memory modules are cascaded in a memory device, the far memory modules may experience some additional latency. In alternate embodiments of the present invention, a bridging memory interface may be configured to connect to the far memory modules in a star configuration to minimize the latency to far memory modules. FIG. 14 is a schematic diagram of a control circuit incorporating a bridging memory interface implementing configurable high-speed serial lanes in alternate embodiments of the present invention. Referring to FIG. 14, a control circuit 200 in a memory module includes a memory data path circuit 202 for communicating with the memory array. The control circuit 200 further includes a data buffer 204 for storing data in transit and an interface control logic circuit 205 for implementing the control functions of the memory interface. The control circuit 200 further includes a set of transceivers 206 (SerDes), each transceiver including a transmitter with serializer and a receiver with deserializer.

In the present embodiment, the control circuit 200 includes (n+1)*X the number of transceivers 206, where X denotes the number of serial lanes in the host connection and n denotes the number of downstream memory modules to be connected. In one example, the control circuit 200 includes 16 transceivers where four transceivers are used for host connection and the remaining three groups of four transceivers are used for connecting to downstream memory modules. As thus configured, the bridging memory interface of the control circuit 200 may be used to connect up to three downstream memory modules to the host connection, with each downstream memory module having only experiencing the latency of the data packets being passed through the front control circuit. The example shown in FIG. 14 is illustrative only and not intended to be limiting. As described, the control circuit 200 may include (n+1)*X number of transceivers to connect to X number of host connection lanes and n number of downstream memory modules.

In embodiments of the present invention, the interface control logic circuit on each control circuit performs negotiations with other connected devices upon power up and determines or discovers the connection configuration of the transceivers. For example, upon power up, the control circuit of the front memory module negotiates with the host processor and with the downstream memory modules to determine the connection of the transceivers to the host processor and to the downstream memory modules.

Figure 15:
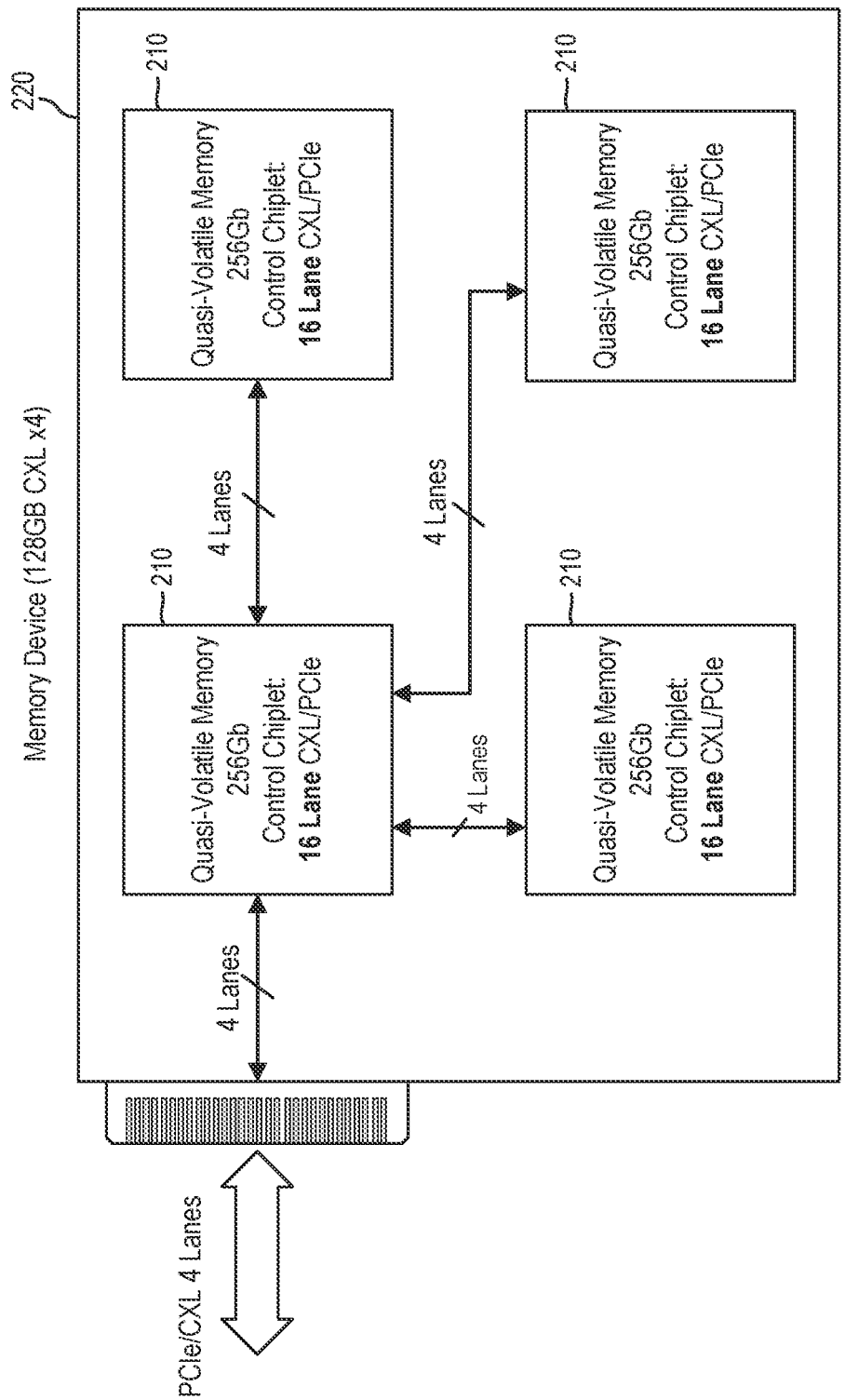
FIG. 15 illustrates an exemplary multi-module memory device in some embodiment of the present invention.

FIG. 15 illustrates an exemplary multi-module memory device in some embodiment of the present invention. Referring to FIG. 15, a multi-module memory device 220 is a 128 GB memory provided over 4 lanes of PCIe bus over CXL protocol. The 4 lanes of PCIe bus is also referred to as the output bus of the memory device 220. The multi-module memory device 220 is constructed using four 256 Gb quasi-volatile memory modules 210, each quasi-volatile memory module being constructed with a control chiplet including 16 transceivers connecting up to 16 serial lanes. In the present embodiment, the quasi-volatile memory modules 210 are configured in a star configuration. That is, the front memory module has four transceivers connected to the 4 serial lanes output bus to connect to the host processor. The front memory module uses the remaining three groups of four transceivers to connect to the other three downstream memory modules. Each downstream quasi-volatile memory module 210 has four transceivers connecting to serial lanes that connect to the front memory module and the other transceivers are not used. Each downstream memory module 210 connects to the output bus through only the front memory module.

Accordingly, the latency to each memory module 210 is limited.

Figure 16:
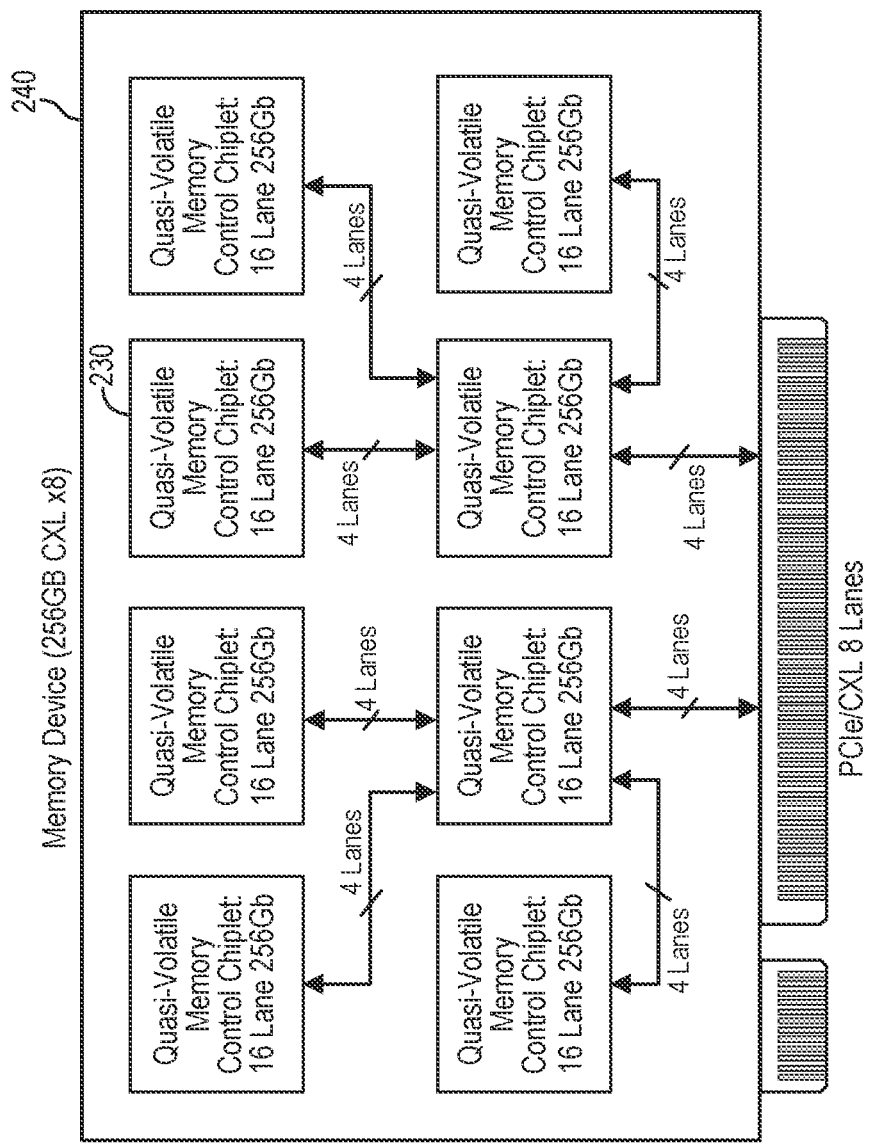
FIG. 16 illustrates an exemplary multi-module memory device in alternate embodiment of the present invention.

FIG. 16 illustrates an exemplary multi-module memory device in alternate embodiment of the present invention. Referring to FIG. 16, a multi-module memory device 240 is a 256 GB memory provided over 8 lanes of PCIe bus over CXL protocol. The 8 lanes of PCIe bus is also referred to as the output bus of the memory device 240. The multi-module memory device 240 is constructed using eight 256 Gb quasi-volatile memory modules 230, each quasi-volatile memory module being constructed with a control chiplet including 16 transceivers connecting up to 16 serial lanes. In the present configuration, the eight memory modules 230 are divided into two groups of four star-connected memory modules. In each group, three memory modules connect to the front memory module in the star configuration and the front memory module connects to four lanes of the output bus of the memory device 240.

In embodiments of the present invention, the interface control logic circuit manages the transfer of data packets between bridged memory modules in a memory device. In some embodiments, the interface control logic circuit of a control circuit inspects the memory address of incoming data packets received from the host or from an upstream memory module and determines if the memory address belongs to the address space of its own memory array or belong to the address space of a downstream memory module. In some examples, the incoming data packets can include memory address, commands and/or write data. Data packets belonging to the control circuit's own address space are routed to the associated memory array. Data packets not belonging to the control circuit's own address space are routed to the downstream memory module. The last memory module does not inspect the memory address and assumes that data packets arriving at the transceivers must be directed to its own memory space. In other embodiments, the interface control logic circuit of a control circuit passes all incoming data packets received from the host or from an upstream memory module to downstream memory modules without inspection. Each memory module receives the incoming data packets and determines if a command is designated for its own address space. Each memory module ignores commands in the data packets that are not designated for its own address space.

For outgoing data packets, such as data packets containing read data, the control circuit receives data packets from downstream serial lanes and the control circuit recognizes the data packets as outgoing data packets intended for the host processor. The control circuit will pass along the data packets to the upstream serial lanes, which can be connected to the host processor or to an upstream memory module. The outgoing data packets are passed along each control chiplet until the data packets are passed to the host connection. In some embodiments, the control circuit adds one or more data bits to the memory address, or otherwise modifies the memory address, of data packets received from a downstream memory module to identify the data packets as originating from a memory module in another memory space.

In some embodiments, the control circuit of the front memory module is provided with configuration information of the memory modules connected to or bridged to it. For example, the control circuit of the front memory module may be provided with information about how many memory modules are bridged and whether the memory modules are cascaded or in star configuration. In some embodiments, a resistance value can be used to program one or more data bits to provide the configuration information. In other embodiments, the memory module configuration could be informed by the front memory module querying the back memory module recursively, for capacity and other parameters. For example, the back memory module aggregates and reports its configuration information forward to the memory module in the upstream. In some examples, each memory module may report the complete memory capacity. The benefits of including an on-board address arbiter in the control circuit is to eliminate the need for an additional switch module for cost and latency.

In some embodiments, the memory module uses a DC method to indicate the memory module configuration. In one example embodiment, each memory module includes a set of configuration pins, each pin being connectable to the ground voltage, the positive power supply voltage or may be left electrically floating. In other examples, other voltage values may be used. The voltage values supplied to the set of configuration pins can be used to indicate to each memory module whether it is connected to any upstream memory modules, any downstream memory modules and how many. In one embodiment, the set of configuration pins may include 2-3 pins. In one example, the configuration pins may be implemented as one or more package pins, such as the package leads or package balls of a ball grid array package.

In the above description, the serial data lanes are sometimes described as being implemented as a PCIe serial bus using the CXL protocol. The use of PCIe serial bus and CXL protocol is illustrative only and not intended to be limiting. The serial data lanes of the present invention can be implemented using any serial bus architecture. The particular architecture or the type of serial data lanes is not critical to the practice of the present invention.

Furthermore, in the above description, the bridging memory interface is applied to bridge or connect memory modules over high speed serial data lanes. In general, the bridging memory interface enables the cascading of discrete memory domains using serial data lines. In other embodiments, the bridging memory interface can be applied to bridge or connect multiple storage devices or storage modules to form a storage system with even bigger capacity while utilizing the same host resource for data transfer. In the present description, storage devices or modules refer to systems or components for storing and accessing data on a long-term basis. In some examples, a storage device or module refers to a solid-state drive or hard drive or other types of non-volatile memories.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A memory module, comprising:
a memory array of storage transistors; and
a control circuit for accessing and operating the memory array, the control circuit comprising a memory interface circuit, the memory interface circuit comprising a plurality of transceivers, each transceiver to be connected to a respective serial data lane, the memory interface circuit configuring a first subset of the transceivers for upstream connections for connecting through one or more serial data lanes to a host processor or connecting to transceivers of an upstream memory module and a second subset of the transceivers for downstream connections for connecting through one or more serial data lanes to transceivers of a downstream memory module,
wherein the control circuit receives a data packet from the host processor or the upstream memory module and inspects the memory address associated with the data packet, and in response to the control circuit determining the memory address of the data packet as not belonging to an address space associated with the memory array, the control circuit transmits the data packet onto one or more transceivers of the second subset to the downstream memory module.

2. The memory module of claim 1, wherein the first subset of the transceivers of the control circuit connects to a host processor and the second subset of the transceivers of the control circuit connects to the transceivers of a first downstream memory module.

3. A memory module, comprising:
a memory array of storage transistors; and
a control circuit for accessing and operating the memory array, the control circuit comprising a memory interface circuit, the memory interface circuit comprising a plurality of transceivers, each transceiver to be connected to a respective serial data lane, the memory interface circuit configuring a first subset of the transceivers for upstream connections for connecting through one or more serial data lanes to a host processor or connecting to transceivers of an upstream memory module and a second subset of the transceivers for downstream connections for connecting through one or more serial data lanes to transceivers of a downstream memory module,
wherein the control circuit receives data packets from the host processor or the upstream memory module and transmits the data packets onto the one or more transceivers of the second subset to the downstream memory module, the control circuit of the memory module and the control circuit of the downstream memory module each inspect the memory addresses associated with the data packets, and in response to the respective control circuit determining the memory address of a given data packet as not belonging to an address space associated with the respective memory array, the respective control circuit ignores the data packet.

4. The memory module of claim 2, wherein the control circuit receives a data packet from the first downstream memory module and transmits the data packet onto one or more transceivers of the first subset to the host processor.

5. The memory module of claim 4, wherein the control circuit modifies the memory address of the data packet received from the first downstream memory module before transmitting the data packet to the host processor.

6. The memory module of claim 2, wherein the control circuit receives a data packet from the host processor and inspects the memory address associated with the data packet, and in response to the control circuit determining the memory address of the data packet as belonging to an address space associated with the memory array, the control circuit processes the data packet and operates the memory array in response to the data packet.

7. The memory module of claim 2, wherein the memory interface circuit configures the first subset of transceivers by negotiating with the host processor and configures the second subset of transceivers by negotiating with the first downstream memory module upon powering up of the memory module.

8. The memory module of claim 2, wherein the memory interface circuit queries the first downstream memory module for parameters associated with the first downstream memory module and determines a configuration of the memory module relative to the first downstream memory module in response to the queries.

9. The memory module of claim 2, wherein the control circuit of the memory module processes data packets having memory addresses belonging to an address space associated with its memory array and containing frequently accessed data and; and the control circuit of the first downstream memory module processes data packets having memory addresses belonging to an address space associated with its memory array and containing infrequently accessed data.

10. The memory module of claim 1, wherein the first subset of the transceivers of the control circuit connects to the transceivers of a first upstream memory module and the second subset of the transceivers of the control circuit connects to the transceivers of a second downstream memory module.

11. The memory module of claim 10, wherein the control circuit receives a data packet from the second downstream memory module and transmits the data packet onto one or more transceivers of the first subset to the first upstream memory module.

12. The memory module of claim 11, wherein the control circuit modifies the memory address of the data packet received from the second downstream memory module before transmitting the data packet to the first upstream memory module.

13. The memory module of claim 10, wherein the control circuit receives a data packet from the first upstream memory module and inspects the memory address associated with the data packet, and in response to the control circuit determining the memory address of the data packet as belonging to an address space associated with the memory array, the control circuit processes the data packet and operates the memory array in response to the data packet.

14. The memory module of claim 10, wherein the memory interface circuit queries the second downstream memory module for parameters associated with the second downstream memory module and determines a configuration of the memory module relative to the second downstream memory module in response to the queries.

15. The memory module of claim 1, wherein each transceiver of the memory interface circuit comprises:
   a transmitter for transmitting data packets onto a respective serial data lane, the transmitter including a serializer to receive parallel data and to generate serial data for transmission onto the serial data lane; and
   a receiver for receiving data packets from the serial data lane, the receiver including a deserializer to receive serial data from the serial data lane and to generate parallel data.

16. The memory module of claim 15, each serial data lane comprises signaling wires in the transmitting direction and the receiving direction.

17. The memory module of claim 1, wherein the first subset of transceivers has the same number of transceivers as the second subset of transceivers.

18. The memory module of claim 1, wherein the memory interface circuit further configures a third subset of transceivers for connecting to transceivers of a third downstream memory module through one or more serial data lanes.

19. The memory module of claim 18, wherein the first subset, the second subset and the third subset of transceivers have the same number of transceivers.

20. The memory module of claim 1, wherein the memory array comprises a memory array formed on a first semiconductor die and the control circuit comprises a memory controller circuit formed on a second semiconductor die interconnected to the first semiconductor die.

21. The memory module of claim 1, wherein the memory array comprises a plurality of memory circuits each formed on a separate semiconductor substrate and interconnected with each other by through-silicon vias formed in the semiconductor substrates; and the control circuit comprises a memory controller circuit formed on a semiconductor substrate separate from the semiconductor substrates of the memory circuits, wherein the memory controller circuit is interconnected to one of the memory circuits and operates the plurality of memory circuits as the memory array.

22. The memory module of claim 21, wherein the memory array comprises 3-dimensional arrays of NOR-type memory strings formed over the semiconductor substrate.

23. A memory device, comprising:
   a plurality of memory modules, each memory module comprising a memory array of storage transistors and a control circuit for accessing and operating the memory array, the control circuit of each memory module comprising a memory interface circuit, the memory interface circuit comprising a plurality of transceivers, each transceiver to be connected to a respective serial data lane, the plurality of memory modules being accessed by a host processor over a host serial link comprising a first number of serial data lanes,
   wherein the plurality of memory modules comprises a first memory module and a second memory module, the memory interface circuit of the first memory module configures a first subset of the transceivers for connecting to the host processor and a second subset of the transceivers for connecting to transceivers of the second memory module through one or more serial data lanes.

24. The memory device of claim 23, wherein the memory interface circuit of the second memory module configures a first subset of the transceivers for connecting to the transceivers of the first memory module through one or more serial data lanes and a second subset of the transceivers for connecting to the transceivers of a third memory module through one or more serial data lanes.

25. The memory device of claim 24, wherein the memory interface circuit of each memory module comprises a number of transceivers being two times the first number, and wherein the first subset of transceivers has the same number of transceivers as the second subset of transceivers.

26. The memory device of claim 25, wherein the first subset of transceivers and the second subset of transceivers each comprises a number of transceivers equal to the first number.

27. The memory device of claim 23, wherein the memory interface circuit of the first memory module includes a third subset of the transceivers for connecting to transceivers of a fourth memory module through a fourth number of serial data lanes.

28. The memory device of claim 27, wherein the memory interface circuit of each memory module comprises a number of transceivers being (n+1) times the first number, where n denotes the number of memory modules connected to the first memory module through the transceivers of the memory interface circuit.

29. The memory device of claim 23, wherein the control circuit of the first memory module receives a data packet from the host processor and inspects the memory address associated with the data packet, and in response to the control circuit determining the memory address of the data packet as not belonging to an address space associated with the memory array of the first memory module, the control circuit transmits the data packet onto one or more transceivers of the second subset to the second memory module.

30. The memory device of claim 23, wherein the control circuit of the first memory module receives data packets from the host processor and transmits the data packets onto the one or more transceivers of the second subset to the second memory module, the control circuit of the first memory module and the control circuit of the second memory module each inspect the memory addresses associated with the data packets, and in response to the respective control circuit determining the memory address of a given data packet as not belonging to an address space associated with the respective memory array, the respective control circuit ignores the data packet.

31. The memory device of claim 23, wherein the control circuit of the first memory module receives a data packet from the second memory module and transmits the data packet onto one or more transceivers of the first subset to the host processor.

32. The memory device of claim 31, wherein the control circuit of the first memory module modifies the memory address of the data packet received from the second memory module before transmitting the data packet to the host processor.

33. The memory device of claim 23, wherein the control circuit of the first memory module receives a data packet from the host processor and inspects the memory address associated with the data packet, and in response to the control circuit determining the memory address of the data packet as belonging to an address space associated with the memory array of the first memory module, the control circuit processes the data packet and operates the memory array in response to the data packet.

34. The memory device of claim 23, wherein the memory interface circuit of the first memory module configures the first subset of transceivers by negotiating with the host processor and configures the second subset of transceivers by negotiating with the second memory module upon powering up of the first memory module.

35. The memory device of claim 23, wherein the memory interface circuit of the first memory module queries the second memory module for parameters associated with the second memory module and determines a configuration of the plurality of memory modules in the memory device in response to the queries.

36. The memory device of claim 23, wherein each transceiver of the memory interface circuit of each memory module comprises:
  a transmitter for transmitting data packets onto a respective serial data lane, the transmitter including a serializer to receive parallel data and to generate serial data for transmission onto the serial data lane; and
  a receiver for receiving data packets from the serial data lane, the receiver including a deserializer to receive serial data from the serial data lane and to generate parallel data.

37. The memory device of claim 36, each serial data lane comprises signaling wires in the transmitting direction and the receiving direction.

38. The memory device of claim 23, wherein the memory array of each memory module comprises a plurality of memory circuits each formed on a separate semiconductor substrate and interconnected with each other by through-silicon vias formed in the semiconductor substrates; and the control circuit comprises a memory controller circuit formed on a semiconductor substrate separate from the semiconductor substrates of the memory circuits, wherein the memory controller circuit is interconnected to one of the memory circuits and operates the plurality of memory circuits as the memory array.

39. The memory device of claim 38, wherein each memory circuit comprises 3-dimensional arrays of NOR-type memory strings formed over the semiconductor substrate.

40. The memory device of claim 23, wherein the plurality of memory modules comprise storage modules forming a storage system.

41. The memory device of claim 23, wherein the control circuit of the first memory module processes data packets having memory addresses belonging to an address space associated with its memory array and containing frequently accessed data and; and the control circuit of the second memory module processes data packets having memory addresses belonging to an address space associated with its memory array and containing infrequently accessed data.

42. The memory device of claim 3, wherein the control circuit receives a data packet from the downstream memory module and transmits the data packet onto one or more transceivers of the first subset to the host processor or the upstream memory module.

43. The memory device of claim 42, wherein the control circuit modifies the memory address of the data packet received from the downstream memory module before transmitting the data packet to the host processor or the upstream memory module.

44. The memory device of claim 3, wherein the control circuit of the memory module processes data packets having memory addresses belonging to an address space associated with its memory array and containing frequently accessed data and; and the control circuit of the downstream memory module processes data packets having memory addresses belonging to an address space associated with its memory array and containing infrequently accessed data.

\* \* \* \* \*